(12) United States Patent
Koduri

(10) Patent No.: US 11,705,414 B2
(45) Date of Patent: Jul. 18, 2023

(54) STRUCTURE AND METHOD FOR SEMICONDUCTOR PACKAGING

(71) Applicant: TEXAS INSTRUMENTS INCORPORATED, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/148,648

(22) Filed: Oct. 1, 2018

(65) Prior Publication Data

US 2019/0109105 A1 Apr. 11, 2019

Related U.S. Application Data

(60) Provisional application No. 62/568,343, filed on Oct. 5, 2017, provisional application No. 62/568,340, filed on Oct. 5, 2017.

(51) Int. Cl.
*H01L 23/00* (2006.01)
*H01L 21/56* (2006.01)
*H01L 23/31* (2006.01)

(52) U.S. Cl.
CPC ............ *H01L 24/05* (2013.01); *H01L 21/561* (2013.01); *H01L 21/565* (2013.01);
(Continued)

(58) Field of Classification Search
CPC ......... H01L 24/05; H01L 24/03; H01L 24/06; H01L 24/96; H01L 21/561; H01L 21/565;
(Continued)

(56) References Cited

U.S. PATENT DOCUMENTS

| 4,931,496 A | * | 6/1990 | Qureshi | ............. | C08G 59/4014 |
| | | | | | 523/400 |
| 5,122,440 A | * | 6/1992 | Chien | ................. | G03F 7/70458 |
| | | | | | 430/313 |

(Continued)

FOREIGN PATENT DOCUMENTS

CN  1518101 A  8/2004

OTHER PUBLICATIONS

International Search Report dated Jan. 31, 2019, International Application No. PCT/US2018/054427, 4 pages.
(Continued)

*Primary Examiner* — Dao H Nguyen
(74) *Attorney, Agent, or Firm* — Michelle F. Murray; Frank D. Cimino

(57) ABSTRACT

A semiconductor packaging structure includes a die including a bond pad and a first metal layer structure disposed on the die, the first metal layer structure having a first width, the first metal layer structure including a first metal layer, the first metal layer electrically coupled to the bond pad. The semiconductor packaging structure also includes a first photosensitive material around sides of the first metal layer structure and a second metal layer structure disposed over the first metal layer structure and over a portion of the first photosensitive material, the second metal layer structure electrically coupled to the first metal layer structure, the second metal layer structure having a second width, where the second width is greater than the first width. Additionally, the semiconductor packaging structure includes a second photosensitive material around sides of the second metal layer structure.

42 Claims, 24 Drawing Sheets

(52) U.S. Cl.
CPC ........ *H01L 21/568* (2013.01); *H01L 23/3114* (2013.01); *H01L 24/03* (2013.01); *H01L 24/06* (2013.01); *H01L 24/96* (2013.01); *H01L 23/3121* (2013.01); *H01L 2224/03013* (2013.01); *H01L 2224/0362* (2013.01); *H01L 2224/03416* (2013.01); *H01L 2224/03464* (2013.01); *H01L 2224/03616* (2013.01); *H01L 2224/0508* (2013.01); *H01L 2224/05013* (2013.01); *H01L 2224/05014* (2013.01); *H01L 2224/05015* (2013.01); *H01L 2224/05016* (2013.01); *H01L 2224/05089* (2013.01); *H01L 2224/05111* (2013.01); *H01L 2224/05144* (2013.01); *H01L 2224/05147* (2013.01); *H01L 2224/05155* (2013.01); *H01L 2224/05164* (2013.01); *H01L 2224/0603* (2013.01); *H01L 2224/06051* (2013.01); *H01L 2924/2064* (2013.01); *H01L 2924/20641* (2013.01); *H01L 2924/20642* (2013.01); *H01L 2924/20643* (2013.01)

(58) Field of Classification Search
CPC ............... H01L 21/568; H01L 23/3114; H01L 23/3121; H01L 2224/03123; H01L 2224/03416; H01L 2224/03464; H01L 2224/03616; H01L 2224/0362; H01L 2224/05013; H01L 2224/05014; H01L 2224/05015; H01L 2224/05016; H01L 2224/0508; H01L 2224/05089; H01L 2224/05111; H01L 2224/05144; H01L 2224/05147; H01L 2224/05155; H01L 2224/05164; H01L 2224/0603; H01L 2224/06051; H01L 2924/2064; H01L 2924/20641; H01L 2924/20642; H01L 2924/20643
USPC ........................................................ 257/762
See application file for complete search history.

(56) References Cited

U.S. PATENT DOCUMENTS

| | | | | |
|---|---|---|---|---|
| 5,840,625 | A * | 11/1998 | Feldner | H01L 21/76846 438/626 |
| 6,174,810 | B1 * | 1/2001 | Islam | H01L 21/76838 438/687 |
| 6,258,426 | B1 * | 7/2001 | Yamamoto | H01L 21/6836 428/40.1 |
| 6,358,849 | B1 * | 3/2002 | Havemann | H01L 21/31053 257/E21.244 |
| 6,713,835 | B1 * | 3/2004 | Horak | H01L 21/7682 257/522 |
| 6,740,392 | B1 * | 5/2004 | Farrar | H01L 21/76849 257/E23.167 |
| 7,755,196 | B2 * | 7/2010 | Barth | H01L 23/5223 257/758 |
| 9,589,909 | B1 * | 3/2017 | Yap | H01L 23/552 |
| 2002/0005583 | A1 * | 1/2002 | Harada | H01L 24/11 257/758 |
| 2003/0122244 | A1 | 7/2003 | Lin et al. | |
| 2004/0150113 | A1 | 8/2004 | Tonegawa | |
| 2006/0006547 | A1 * | 1/2006 | Matsunaga | H01L 21/76801 257/774 |
| 2006/0009026 | A1 | 1/2006 | Sawaguchi et al. | |
| 2011/0006413 | A1 * | 1/2011 | Lee | H01L 21/561 257/686 |
| 2012/0013011 | A1 * | 1/2012 | Hampp | H01L 21/76837 257/762 |
| 2012/0248609 | A1 * | 10/2012 | Tomita | H01L 21/76804 257/751 |
| 2013/0069219 | A1 * | 3/2013 | Uchiyama | H01L 25/0657 257/734 |
| 2013/0249080 | A1 * | 9/2013 | Lin | H01L 21/568 257/737 |
| 2013/0251965 | A1 * | 9/2013 | Rao | G03F 7/004 428/206 |
| 2014/0264930 | A1 | 9/2014 | Yu et al. | |
| 2015/0041985 | A1 * | 2/2015 | Hsieh | H01L 23/525 257/773 |
| 2015/0108644 | A1 * | 4/2015 | Kuang | H01L 25/043 257/751 |
| 2015/0371963 | A1 | 12/2015 | Castro et al. | |
| 2016/0300804 | A1 | 10/2016 | Omori | |
| 2017/0125365 | A1 * | 5/2017 | Cheng | H01L 21/31111 |
| 2017/0162497 | A1 * | 6/2017 | Hu | H01L 23/528 |
| 2017/0323869 | A1 * | 11/2017 | Chen | H01L 24/05 |
| 2018/0033747 | A1 * | 2/2018 | Shih | H01L 23/5389 |
| 2019/0019757 | A1 * | 1/2019 | Lee | H01L 24/20 |
| 2019/0035757 | A1 * | 1/2019 | Yu | H01L 23/5383 |
| 2019/0051607 | A1 * | 2/2019 | Suk | H01L 23/5386 |

OTHER PUBLICATIONS

International Search Report dated Jan. 31, 2019, International Application No. PCT/US2018/054427, Written Opinion dated Jan. 31, 2019, 6 pages.

Rosson, Jim; "NanoStar & NanoFree 300um Solder Bump Wafer Chip-Scale Package Application," Texas Instruments Incorporated, Application Report, 21 pgs., SBVA017—Feb. 2004.

Koukharenko, E; Kraft, M; Ensell, G.J.; Hollinshead, N; "A Comparative Study of Different Thick Photoresists for MEMS Applications", Journal of Materials Science: Materials in Electronics 16 (2005) 741-747.

Extended European Search Report dated Nov. 11, 2020, European Application No. 1886416.4, 13 pages.

First Office Action dated Jan. 18, 2023, Chinese Application No. 201880072031.4, 30 pages.

* cited by examiner

STRUCTURE AND METHOD FOR SEMICONDUCTOR PACKAGING

CROSS-REFERENCE TO RELATED APPLICATION

This application claims the benefit of U.S. Provisional Patent Application No. 62/568,343, filed on Oct. 5, 2017, and entitled "Industrial Fan-out Chip Scale Package," and of U.S. Provisional Patent Application No. 62/568,340, filed on Oct. 5, 2017, and entitled "Wafer Chip Scale Package," both these applications are incorporated herein by reference in their entireties.

BACKGROUND

With the increasing proliferation and functionality of electronics, the size and cost of semiconductor devices, such as transistors and integrated circuits (ICs), is reducing. As the size of semiconductor devices is reduced, power and current density increase, which may lead to high temperatures and premature packaging failures. As die shrink, current density in the packaging increases. The decreasing size of the die may lead to issues, such as electromigration and breakage of the conducting line, related to the packaging of the die.

SUMMARY

At least one example semiconductor packaging structure includes a die including a bond pad and a first metal layer structure disposed on the die, the first metal layer structure having a first width, the first metal layer structure including a first metal layer, the first metal layer electrically coupled to the bond pad. The semiconductor packaging structure also includes a first photosensitive material around sides of the first metal layer structure and a second metal layer structure disposed over the first metal layer structure and over a portion of the first photosensitive material, the second metal layer structure electrically coupled to the first metal layer structure, the second metal layer structure having a second width, where the second width is greater than the first width. Additionally, the semiconductor packaging structure includes a second photosensitive material around sides of the second metal layer structure.

At least one example semiconductor packaging structure includes a die including a bond pad and a first metal layer structure disposed on the die, the first metal layer structure including a first metal layer, the first metal layer electrically coupled to the bond pad, and the first metal layer having a first width. The semiconductor packaging structure also includes a first insulating material around sides of the first metal layer structure and a second metal layer structure disposed over the first metal layer structure and over at least a portion of the first insulating material, the second metal layer structure electrically coupled to the first metal layer structure, the second metal layer structure having a planarized surface, the second metal layer structure having a second width, where the second width of the second metal layer structure is greater than the first width of the first metal layer structure. Additionally, the semiconductor packaging structure includes a second insulating material around sides of the second metal layer structure and a plate layer disposed on the planarized surface of the second metal layer structure, where the plate layer extends above a top surface of the second insulating material.

At least one example semiconductor packaging structure includes a die including a bond pad and a first metal layer structure disposed on the die, the first metal layer structure including a first metal layer, the first metal layer electrically coupled to the bond pad. The semiconductor packaging structure also includes a first insulating material around sides of the first metal layer structure and a second metal layer structure disposed over the first metal layer structure and over a portion of the first insulating material, the second metal layer structure electrically coupled to the first metal layer, where the second metal layer structure extends beyond an edge of the die. Additionally, the semiconductor packaging structure includes a second insulating material around sides of the second metal layer structure.

At least one example method includes applying a first insulating material to a semiconductor structure, the semiconductor structure including a bond pad and forming an opening in the first insulating material, exposing at least a portion of the bond pad. The method also includes depositing a first seed layer over the first insulating material and in the opening of the first insulating material and plating a first metal layer over the first seed layer and in the opening of the first insulating material. Additionally, the method includes performing chemical-mechanical polishing (CMP) on at least a portion of the first metal layer, the first seed layer, and the first insulating material, to form a first metal layer structure in the opening in the first insulating material and applying a second insulating material over the first insulating material and over the first metal layer structure. Also, the method includes forming an opening in the second insulating material, exposing at least a portion of the first metal layer structure and at least a portion of the first insulating material and depositing a second seed layer over the second insulating material and in the opening of the second insulating material. The method also includes plating a second metal layer over the second seed layer and in the opening of the second insulating material and performing CMP on the second metal layer, on the second seed layer, and on the second insulating material, to form a second metal layer structure, in the opening of the second insulating material, the second metal layer structure including the second metal layer and the second seed layer.

At least one example method includes applying a first insulating material to a semiconductor structure, the semiconductor structure including a bond pad and forming an opening in the first insulating material, exposing at least a portion of the bond pad. The method also includes applying a second insulating material over the first insulating material and in the opening of the first insulating material and forming an opening in the second insulating material extending through at least a portion of the opening of the first insulating material, exposing at least a portion of the bond pad. Additionally, the method includes depositing a seed layer over the second insulating material, in the opening of the second insulating material and of the first insulating material and plating a metal layer over the seed layer, in the opening of the second insulating material and of the first insulating material. Also, the method includes performing CMP on at least a portion of the metal layer, on the seed layer, and on the second insulating material, to form a first metal layer structure in the opening of the first insulating material and a second metal layer structure in the opening of the second insulating material.

BRIEF DESCRIPTION OF THE DRAWINGS

FIGS. 10A-0 illustrate an additional method of fabricating a semiconductor packaging structure;

DETAILED DESCRIPTION

Figure 1:
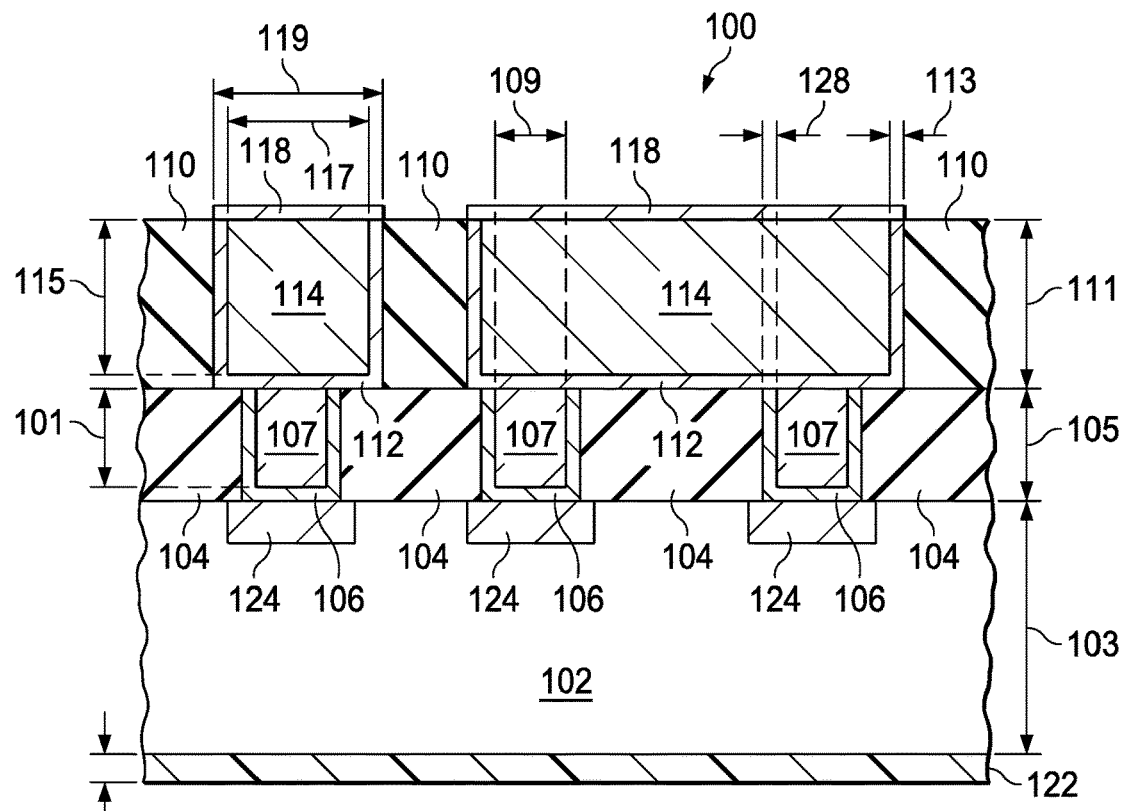
FIG. 1 illustrates a cross sectional view of an example semiconductor packaging structure.

The size and cost of semiconductor devices, such as transistors and integrated circuits (ICs), is reducing. As the size of semiconductor devices is reduced, power and current density increase, which may lead to high temperatures and premature packaging failures. As die shrink, current density in the packaging increases. The decreasing size of the die may lead to issues related to the packaging of the die, such as electromigration and packaging failure.

As will be described in detail, an embodiment semiconductor packaging structure for chip scale packaging does not contain solder within the semiconductor packaging structure. The lack of solder inside the semiconductor packaging structure may reduce electromigration and reduce high temperature issues, improving reliability.

As will be described in detail, an embodiment semiconductor packaging structure, chip scale packaging protects the die while providing for a flexible footprint. For example, an embodiment semiconductor packaging structure uses multiple metal layers to effectively couple a small area of a die to a large area on a semiconductor packaging structure for coupling to a printed circuit board (PCB). Accordingly, the current on the outer portion of the semiconductor packaging structure is spread over a larger area than the current near the die, improving the durability of the semiconductor packaging structure.

As will be described in detail, in an embodiment semiconductor packaging structure, barrier metals, such as seed layers and plating layers, fully surrounds copper containing materials. Surrounding the copper containing material prevents copper migration and improves reliability of the semiconductor packaging structure.

As will be described in detail, an embodiment semiconductor packaging structure does not contain wire bonds. The lack of wire bonds in the semiconductor packaging structure improves reliability and reduces parasitics.

As will be described in detail, an embodiment semiconductor packaging structure does not contain mold compound or additional encapsulation. The lack of additional encapsulation reduces the size and cost of the semiconductor packaging structures. Additionally, the lack of encapsulation avoids failure modes from additional materials, processing, and weight.

As will be described in detail, an embodiment semiconductor packaging structure can operate at high temperatures, for example higher than 200 degrees Celsius, for long periods of time, for example over 50 hours.

In an embodiment semiconductor packaging structure, the package size is the same as the die size. This reduces the amount of packaging material and improves efficiency.

As will be described in detail, an embodiment semiconductor packaging structure transfers a high amount of power from the die to external connections. For example, an embodiment semiconductor packaging structure may transfer between 2 mW and 5 W of power.

As will be described in detail, an embodiment semiconductor packaging structure does not use a lead frame or other packaging substrate. The lack of a lead frame or other packaging structure reduces the size of the semiconductor packaging structure.

As will be described in detail, an embodiment semiconductor packaging structure contains a die in a mold compound, where the semiconductor packaging structure does not contain exposed silicon. Accordingly, the die is mechanically, optically, and environmentally protected. Multiple metal layers, where subsequent metal layers are wider than the initial layers, may be known as fan out routing. In an embodiment semiconductor packaging structure, fan out routing extends beyond the edge of the die.

FIG. 1 illustrates a cross sectional view of a semiconductor packaging structure 100 for chip scale packaging. In at least one embodiment, the semiconductor packaging structure 100 does not contain solder. A semiconductor structure, such as a substrate 102 in the semiconductor packaging structure 100, is a die or a portion of a wafer, containing at least one semiconductor device (e.g. at least one transistor) or an integrated circuit. Bond pads 124, disposed on one surface of the substrate 102, are electrically coupled to at least one of the semiconductor devices. The bond pads 124 are the topmost layer in a die or a wafer. In an embodiment, there is no semiconductor material above the bond pads 124. In at least one embodiment (not pictured), the top surface of the bond pads 424 is slightly below the top surface of the substrate 102. A portion of the bond pads 424 may be covered with polyimide. A back side coat 122, which may be an opaque film, for example a black film, is disposed on the opposite side of the substrate 102 to the bond pads 124. The back side coat 122 has a thickness 126 from about 10 μm to about 60 μm, for example from about 25 μm to about 35 μm. The substrate 102 has a thickness 103, which may be from about 50 μm and about 500 μm, for example from about 200 μm to about 300 μm.

An insulating material 104 is disposed on the substrate 102 over the bond pads 124. The insulating material 104 may have low moisture absorption, low modulus of elasticity, and high adhesion. In at least one example, the insulating material 104 is a polymer. In an embodiment, the insulating material 104 is an epoxy based near ultraviolet (for example between about 350 nm and about 400 nm) photoresist. In an additional embodiment, the insulating material 104 is an acrylate based photoresist, or a novalak based photoresist. For example, the insulating material 104 may have a modulus of elasticity of between about 2 GPa and 6 GPa. In an embodiment, the insulating material 104 has a Poisson ratio of from about 0.2 to about 0.25. In an embodiment, the insulating material 104 has a film stress of between 15 Mpa and 65 Mpa, for example between about 16 Mpa and about 19 Mpa. In an embodiment, the insulating material 104 has a maximum sheer of about 0.01. The insulating material 104 may have a friction coefficient of about 0.2 In an embodiment, the insulating material 104 has a coefficient of thermal expansion between about 20 ppm/K and about 55 ppm/K. The insulating material 104 may be a photosensitive material that is capable of withstanding the stresses of manufacturing and operation. The insulating material 104 may be thicker than a conventional photoresist. In an example, the photosensitive material is a permanent photoresist, for example SU-8, Riston™, TMMR-S2000™, or TMMF-S2000™. A permanent photoresist is a photoresist that is designed to not be easily removed. A permanent photoresist is sufficiently robust to withstand subsequent processing steps. In an embodiment, a permanent photoresist is thicker than traditional photoresist, for example greater than 5 μm, or greater than 50 μm. In at least one example, the insulating material 104 may be a material that is not photosensitive, such as a mold compound. In at least one embodiment, the insulating material 104 has a thickness 105 of between about 5 μm and about 100 μm, for example between about 50 μm and about 80 μm. The thickness 105 of the insulating material 104 may be greater than 50 μm, for example about 100 μm.

A first metal layer structure includes first metal layer 107 and a seed layer 106. The first metal layer 107 is electrically coupled to the bond pads 124. Also, the first metal layer structure, including the first metal layer 107 and the seed layer 106, and the insulating material 104, have a planarized top surface. Insulating material 104 is disposed around the sides of the first metal layer structure. The first metal layer 107 and the seed layer 106 are disposed in openings of the insulating material 104. The first metal layer 107 provides standoff thickness and flexibility for microstresses. In at least one embodiment, the first metal layer 107 contains copper, or is an alloy of conductive metals. The seed layer 106 is disposed between the first metal layer 107 and the insulating material 104. The seed layer 106 provides a barrier between the first metal layer 107 and the insulating material 104, preventing creepage of the copper in the first metal layer 107 and protecting the first metal layer 107 from moisture. The seed layer 106 may contain titanium, a titanium alloy, such as TiW, tantalum, or a tantalum alloy such as TaN. The seed layer 106 has a thickness 128 of less than 2 μm. In at least one example, the first metal layer 107 has a width 109, which may be between 20 μm and 200 μm, and a thickness 101, which may be between 4 μm and 100 μm. In at least one example, the thickness 101 of the first metal layer 107 and a thickness of the seed layer 106 are approximately equal to the thickness 105 of the insulating material.

An insulating material 110 is disposed on the planarized surface of the insulating material 104, the first metal layer 107, and the seed layer 106. In at least one example, the insulating material 110 is a polymer. The insulating material 110 may be a photosensitive material, such as a permanent photoresist, for example SU-8, Riston™, AZ-9260 TMMR-S2000™, or TMMF-S2000™. In some examples, the insulating material 110 is a non-photosensitive material, such as a mold compound. In at least one example, the insulating material 110 is composed of the same material as the insulating material 104. The insulating material 110 may be distinguishable from the insulating material 104 when they are composed of the same type of material by the planarized surface of the insulating material 104. The surface of the insulating material 104 may be planarized by a chemical mechanical polishing (CMP) process performed on the insulating material 104 before the forming of the insulating material 110. In another example, the insulating material 110 is composed of a different material than the insulating material 104. A thickness 111 of the insulating material 110 is from about 25 μm to about 300 μm, for example between about 100 μm and about 200 μm. In at least one example, the thickness 111 of the insulating material 110 is greater than 250 μm. The thickness 111 of the insulating material 110 may be greater than the thickness 105 of the insulating material 104. In at least one example, the thickness 111 of the insulating material 110 is the same as the thickness 105 of the insulating material 104, or the thickness 111 of the insulating material 110 is less than the thickness 105 of the insulating material 104.

A second metal layer structure, containing a second metal layer 114 and a seed layer 112, is disposed in openings of the insulating material 110 at least partially over the first metal layer structure. The seed layer 112 may at least partially coat the bottom and/or the side walls of the opening, and the second metal layer 114 is formed on the seed layer 112. In at least one example, the second metal layer structure completely covers the first metal layer structure. The second metal layer 114 is electrically coupled to the first metal layer 107. The seed layer 112 physically separates the second metal layer 114 from the insulating material 110, providing a barrier. The seed layer 112, which may be composed of Ti, TiW, Ta, or TaN, has a thickness 113 of less than 2 μm. In at least one example, the seed layer 106 and the seed layer 112 together completely surround the first metal layer 107, with the seed layer 112 separating the second metal layer 114 from the first metal layer 107. In other examples, there is no seed layer between the first metal layer 107 and the second metal layer 114, and the first metal layer 107 might not be distinguishable from the second metal layer 114. In at least one example, the second metal layer 114, the seed layer 112, and the insulating material 110 have a planarized surface. The second metal layer 114 is sufficiently thick to spread the current, and provide good mechanical strength. Spreading the current reduces electromigration and reduces the current density, reducing heat dissipation and improves reliability. The second metal layer 114 is composed of a metal, such as a copper containing material, or is an alloy of conductive metals. The second metal layer 114 has a thickness 115 of between about 25 μm and 300 μm, and a width 117 of more than 150 μm. In at least one example, the width 117 of the second metal layer 114 is greater than the width 109 of the first metal layer 107. In at least one example, the thickness 115 of the second metal layer is greater than the thickness 101 of the first metal layer 107. In at least one example, the second metal layer 114 is composed of the same material as the first metal layer 107. At least one embodiment contains additional elements, such as passives or sensors, between the first metal layer 107 and the second metal layer 114.

A plate layer 118 is disposed on the planarized surface of the second metal layer 114, and the seed layer 112. The plate layer 118 extends above the top surface of the insulating material 110. The plate layer 118 may be composed of nickel, tin, or a nickel alloy, such as NiAu, NiPd, NiPdAu, NiAg, or NiSn. In at least one example, the plating layer 418 is a solderable metal stack, such as electroless nickel immersion gold (ENIG), electroless nickel electroless gold (ENEG), or electroless nickel electroless palladium immersion gold (ENEPIG). In ENIG and ENEPIG, a thin layer of gold protects nickel from oxidation. In at least one example, the plate layer 118 has a thickness 115 of between about 2 μm and 8 μm. In at least one example, the plate layer 118 extends the thickness 115 above the planarized surface of the second metal layer 114, the seed layer 112, and the insulating material 110. The plate layer 118 has a width 119, for example between about 25 µm and about 300 µm, providing a low resistance. A wide width of the plate layer 118 reduces the current density and the heat dissipation, improving reliability. The plate layer 118 protects the metal in the second metal layer 114 and the first metal layer 107, while providing a robust solder joint that is resistant to breakage. Copper in the second metal layer 114 and in the first metal layer 107 is fully surrounded by the seed layers 106 and 112 and the plate layer 118.

The semiconductor packaging structure 100 may be separated into die. The plate layer 118 is used to attach the die to a printed circuit board (PCB), providing electrical and thermal connections between transistors in the substrate 102 and the PCB. The electrical connection from the plate layer 118, through the second metal layer 114, through the seed layer 112, through the first metal layer 107, through the seed layer 106 to the bond pads 124 provides a low resistance, for example from about 2 mΩ to about 5 mΩ. A low resistance reduces heat and electromigration and improves reliability.

Figure 2:
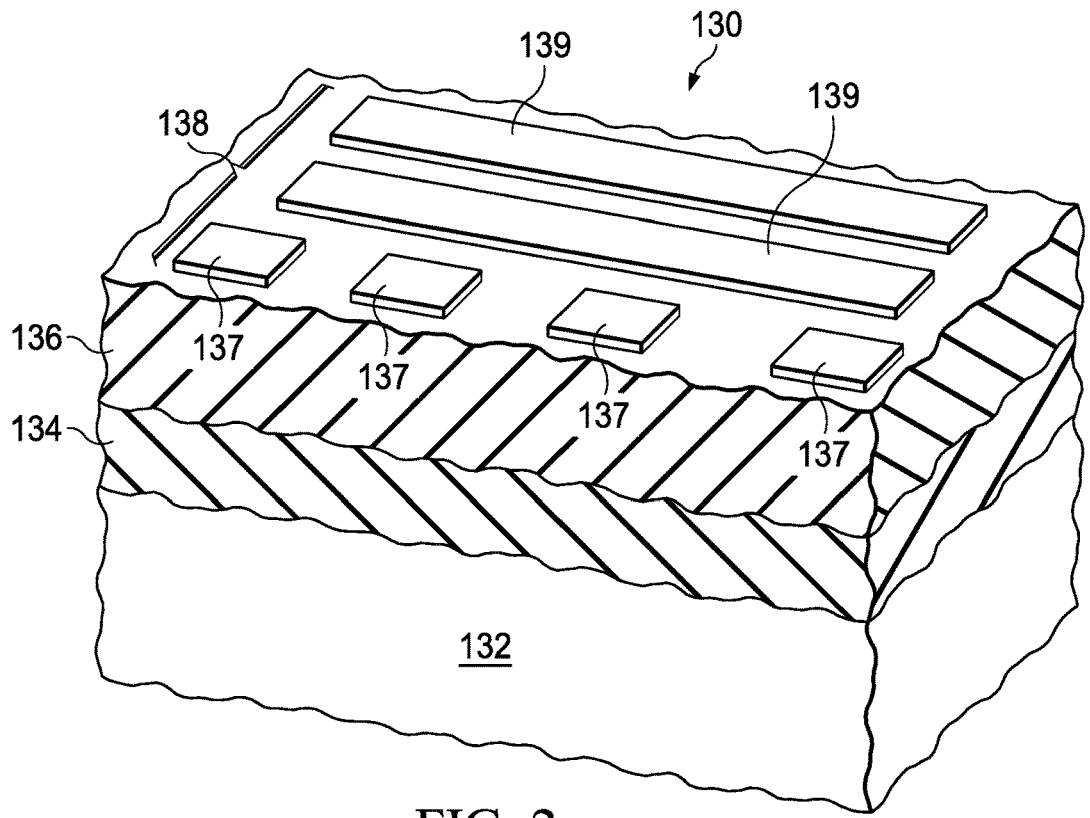
FIG. 2 illustrates another example semiconductor packaging structure.

FIG. 2 illustrates a three dimensional view of a semiconductor packaging structure 130. The semiconductor packaging structure 130 includes a substrate layer 132, a first metal and insulating material layer 134, a second metal and insulating material layer 136, and a plate layer 138. The substrate layer 132 forms a die with at least one semiconductor device. The first metal and insulating material layer 134, above the substrate layer 132, contains an insulating material, such as a permanent photoresist, and first metal layer structure, which may be composed of copper surrounded by a seed layer. Above the first metal and insulating material layer 134, the second metal and insulating material layer 136 contains another insulating material, such as another permanent resist layer, and a second metal layer, which may contain copper, at least partially surrounded by a seed layer. The plate layer 138, composed of a solderable material, extends above the top, planarized surface of the second metal and insulating material layer 136. In at least one example, large pads or strips in the plate layer 138 are used for some connections, for example for power pins, while smaller pads in the plate layer 138 are used for other connections, for example for signal pins. The plate layer 138 may be soldered to a PCB to connect the semiconductor in the substrate layer 132 to the PCB. The plate layer 138 includes four smaller strips 137 in a row and two long strips 139 in parallel. The smaller strips 137 are useful for lower current connections (signal pins), keeping current density sufficiently low while keeping the area low, while the long strips 139 are useful for higher current connections (power pins), reducing the current density. However, the plate layer is highly customizable, and may contain any pattern.

FIGS. 3A-H illustrate example top down cross-sectional views of horizontal cross sections of first metal layer structure and second metal layer structure configurations. The first metal layer cross section is in the direction of the width 109 in the semiconductor packaging structure 100 illustrated by FIG. 1 and the second metal layer cross section is in the direction of the width 117 in the semiconductor packaging structure 100 illustrated by FIG. 1. One semiconductor packaging structure may contain different sizes and shapes of the first metal layer structure and different sizes and shapes of the second metal layer structure. The second metal layer structure have a larger, possibly much larger, area than the first metal layer structure. In at least one example, the second metal layer structure and the first metal layer structure have similar shapes. In other examples, the second metal layer structure and the first metal layer structure have different cross sectional shapes. In at least one example, there are multiple first metal layer structure coupled to a second metal layer structure. In other examples, there is one first metal layer structure coupled to a second metal layer structure.

Figure 3A:
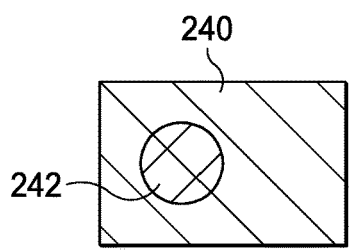
FIGS. 3A-H illustrate cross sectional views of an example first metal layer and an example second metal layer.
Figure 3B:
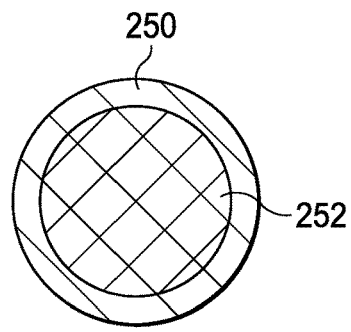
Figure 3C:
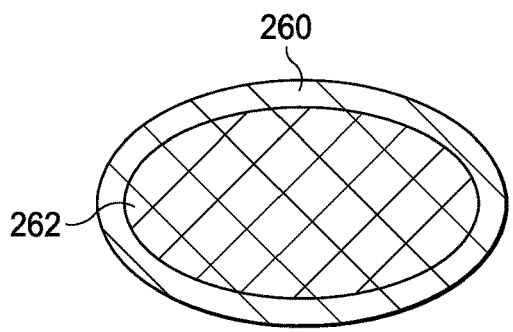
Figure 3D:
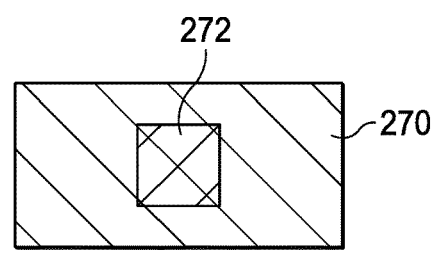
Figure 3E:
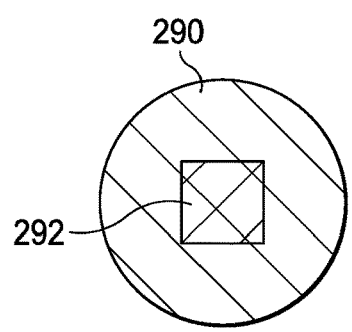

In FIG. 3A, a second metal layer structure 240 has a rectangular cross section and a first metal layer structure 242 has a circular cross section. In at least one example, the second metal layer structure 240 may have a square cross section. In FIG. 3B, a second metal layer structure 250 has a circular cross section and a first metal layer structure 252 also has a circular cross section. In FIG. 3C, a second metal layer structure 260 and a first metal layer structure 262 both have oval cross sections. In FIG. 3D, a second metal layer structure 270 has a rectangular cross section, and a first metal layer structure 272 has a square cross section. In at least one example, the first metal layer structure 272 has a cross section that is rectangular but not square. In FIG. 3E, a second metal layer structure 290 has a circular cross section and a first metal layer structure 292 has a square cross section. In other examples, the first metal layer structure and second metal layer structure may have other shapes, for example they may be shaped as a triangle, or another polygon, such as a pentagon, hexagon, or octagon, or an irregular shape.

Figure 3F:
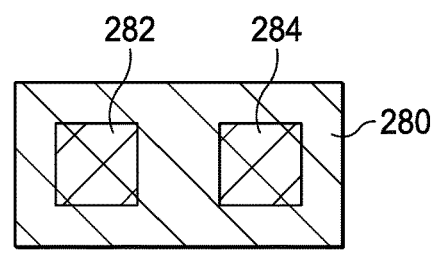

In FIG. 3F, a first metal layer structure 284 and a first metal layer structure 282 have square cross sections, and a second metal layer structure 280 has a rectangular cross section. In at least one example, the first metal layer structure 282 couples the second metal layer structure 280 to a first bond pad, and the first metal layer structure 284 couples the second metal layer structure 280 to a second bond pad. In at least one example, the first metal layer structure 282 and 284 may have various cross sectional shapes, for example circular or rectangular. In at least one example, the first metal layer structure 282 has a different cross sectional shape than the first metal layer structure 284. For example, the first metal layer structure 282 has a square cross section and the first metal layer structure 284 has a circular cross section. While two first metal layer structures 282 and 284 are pictured coupled to the second metal layer structure 280, there may be more first metal layer in a second metal layer, for example three, four, five, six, seven, or eight. These different first metal layer structures may contact various locations in the underlying integrated circuit.

Figure 3G:
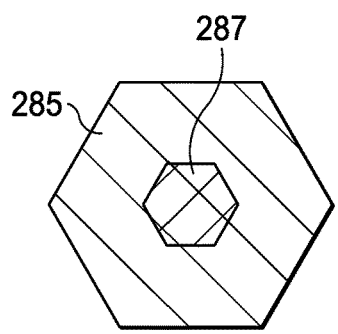
Figure 3H:
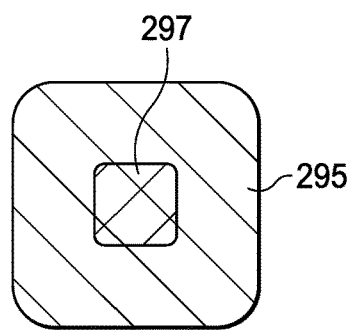

In FIG. 3G, a first metal layer structure 287 has a hexagon cross section, and the second metal layer structure 285 has a hexagon cross section. In other embodiments, the first metal layer structure and the second metal layer structure may be different polygons, for example pentagons, heptagons, octagons, or decagons. In some embodiments, the first metal layer structure and the second metal layer structure may be different polygons. In FIG. 3H, the first metal layer structure 297 and the second metal layer structure 295 are rounded rectangles. In other embodiments, the first metal layer structure and the second metal layer structure may be different rounded polygons, such as rounded pentagons, rounded hexagons, rounded heptagons, rounded octagons, or rounded decagons.

Figure 4:
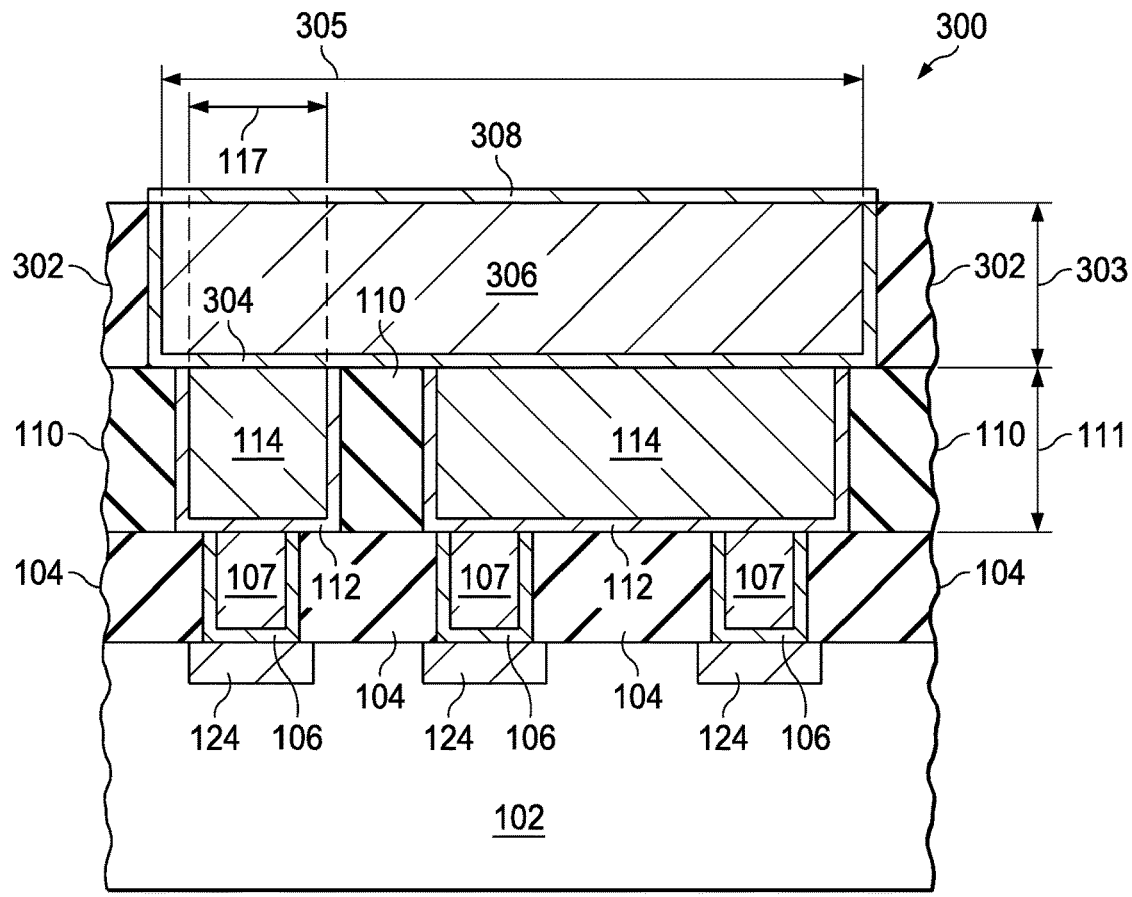
FIG. 4 illustrates a cross sectional view of another example semiconductor packaging structure.

Some example semiconductor packaging structures may have more than two layers of insulator material with increasingly wide metal features. FIG. 4 illustrates a semiconductor packaging structure 300 with three layers of insulating material with metal features. Other semiconductor packaging structures may have more layers of insulator and metal, for example four, five, or six layers. In the semiconductor packaging structure 300, insulating material 302 lies above the planarized surface of the insulating material 110, the second metal layer 114, and the seed layer 112. The insulating material 302 may be composed of a photosensitive material, such as a permanent resist. In one embodiment, the insulating material 302 is composed of the same material as the insulating material 110 and the insulating material 104. The insulating material 302 may be distinguishable from the insulating material 110 when they are composed of the same type of material due to the planarized surface of the insulating material 110 formed by CMP being performed on the insulating material 110 before the insulating material 302 is formed. In other examples, the insulating material 302 is a different material than the insulating material 110, and/or the insulating material 302 is a different material than the insulating material 104. The insulating material 302 may have a thickness 303 greater than a thickness 111 of the insulating material 110, for example between about 100 μm and about 500 μm.

A third metal layer structure, including a third metal layer 306 and a seed layer 304, lies in an opening of the insulating material 302, over the second metal layer 114 and a portion of the insulating material 110. The third metal layer 306 may be composed of a copper containing material. The seed layer 304, for example titanium, tantalum, a titanium alloy, or a tantalum alloy physically separates the third metal layer 306 from the insulating material 302. As pictured, the second metal layer 114 is completely surrounded by the seed layer 112 and the seed layer 304, and lies between the third metal layer 306 and the second metal layer 114. In other examples, the third metal layer 306 directly contacts the second metal layer 114, without an intermediate seed layer. The third metal layer 306 may be significantly wider than the second metal layer 114. For example, the third metal layer may have a width 305 between about 100 μm and about 500 μm wide.

A plate layer 308, for example nickel, tin, a nickel alloy, ENIG, ENEG, or ENEPIG, lies above the third metal layer 306, and extends above the top surface of the third metal layer 306 and the insulating material 302. In at least one example, the plate layer 308 and the seed layer 304 completely surround the third metal layer 306. There is a low resistance connection from the plate layer 308, through the third metal layer 306, optionally through the seed layer 304, through the second metal layer 114, optionally through the seed layer 112, through the first metal layer 107, and through the seed layer 112, to the bond pads 124. The plate layer 308 may be connected to a PCB, to electrically couple the PCB to the bond pads 124 and the underlying circuitry.

Figure 5:
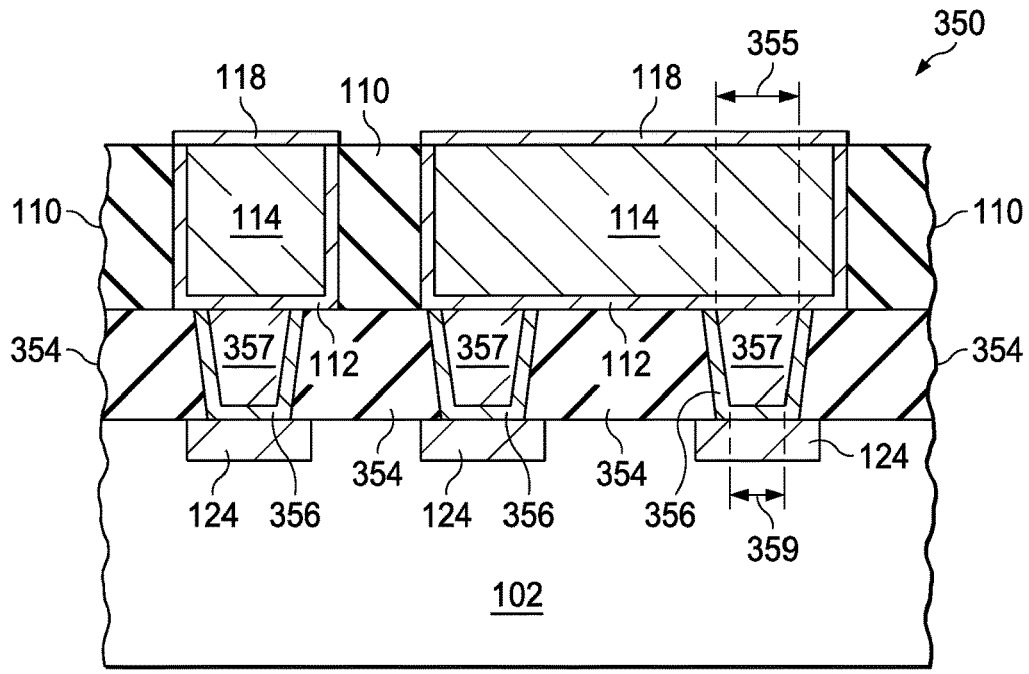
FIG. 5 illustrates a cross sectional view of an additional example semiconductor packaging structure.

FIG. 5 illustrates a semiconductor packaging structure 350, where a first metal layer 357 is tapered through an insulating material 354. The bottom portion of the first metal layer 357, which contacts the bond pads 124 through the seed layer 356, are narrower than the top portions of the first metal layer 357, which contact the second metal layer 114. The first metal layer 357 has a top width 355 at the second metal layer 114 and a bottom width 359 at the bond pads 124, where the top width 355 is greater than the bottom width 359. In at least one example, the sides of the second metal layer 114 may also be tapered, to be narrower on the die side and wider on the external contact side.

Figure 6A:
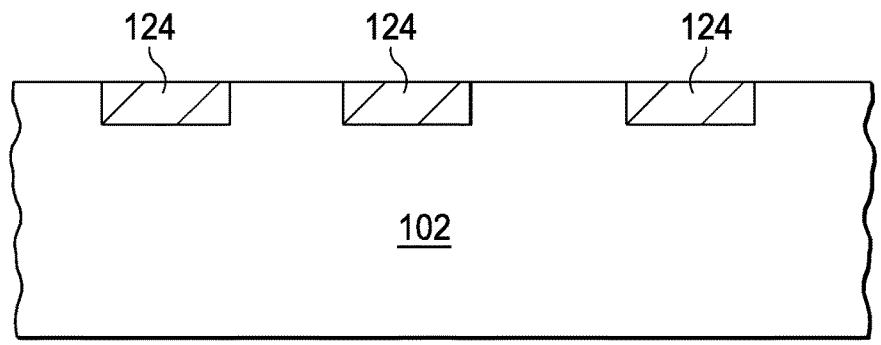
FIGS. 6A-L illustrate an example method of fabricating a semiconductor packaging structure.

FIGS. 6A-L illustrate an example method of fabricating a semiconductor packaging structure. FIG. 6A illustrates a substrate 102, which may be a silicon substrate, containing at least one semiconductor device. Bond pads 124, which provide electrical connections to the at least one semiconductor device, are disposed on a surface of the substrate 102. In at least one example, polyimide (PI) is added to the substrate 102, over at least a portion of the bond pads 124. The PI further decouples the pin locations between the die and the packaging.

Figure 6B:
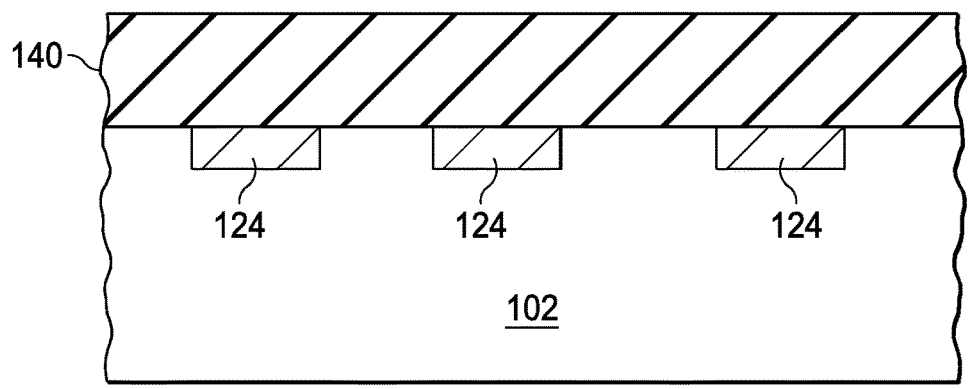

In FIG. 6B, an insulating material 140 is formed on the substrate 102, on the same side as the bond pads 124. The insulating material 140 is a polymer. In one embodiment, the insulating material 140 is a photosensitive material, such as a permanent photoresist, for example SU-8, Riston™, SPR 220-7, Ordyl P-50100, Diaplate 132, or another permanent photoresist, such as a permanent photoresist manufactured by TOK™, for example TMMR-52000™ or TMMF-52000™. In another embodiment, the insulating material 110 is a mold compound. In at least one example, the insulating material 140 is formed by spin coating a liquid on the substrate 102. In another embodiment, the insulating material 140 is formed by laminating a dry film on the substrate 102. In an additional embodiment, the insulating material 140 is formed by spray coating a photoresist. A dry-film material may enable a greater thickness and less shrinkage or stress, compared to a liquid. Then, a soft bake may be performed on the liquid or film to remove solvent. In at least one example, for example where the insulating material has a low amount of solvent, the soft bake is not performed. The insulating material 140 is thick, for example between about 5 μm and about 100 μm thick.

Figure 6C:
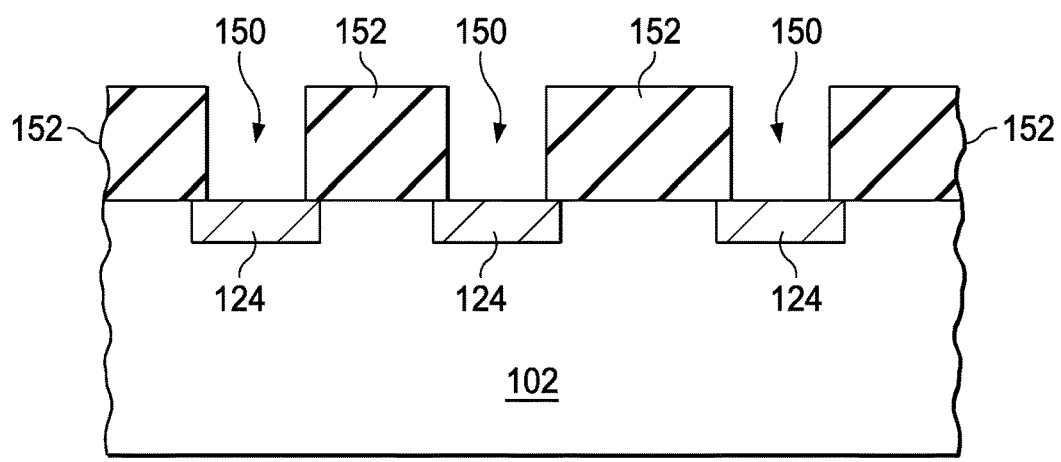

In FIG. 6C, openings 150 are formed in the insulating material 140 over the bond pads 124, exposing at least a portion of the bond pads 124, and retaining the insulating material 152. In at least one example where the insulating material is a permanent photoresist, the openings 150 are formed by exposing the permanent photoresist using a photolithography mask. In another embodiment, the insulating material 140 is patterned by laser etching or by plasma etching.

Figure 6D:
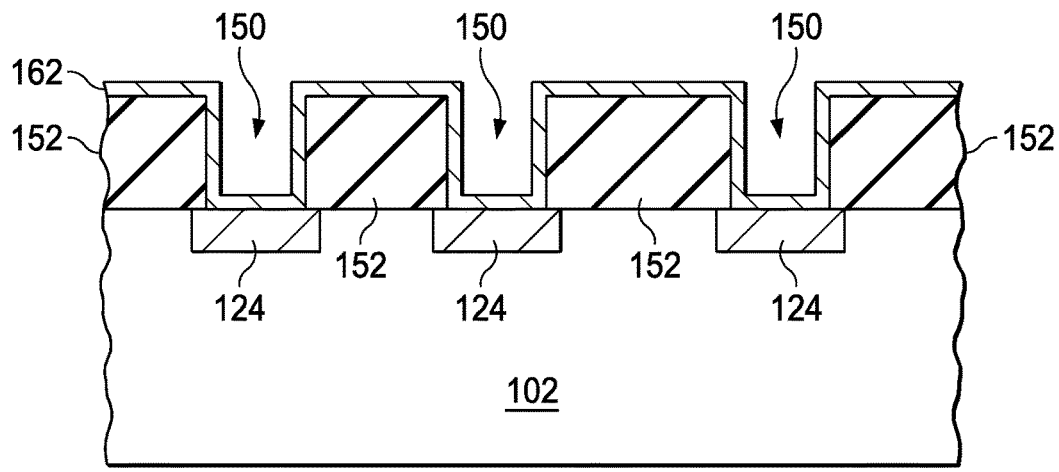

In FIG. 6D, a seed layer 162 is deposited on the insulating material 152, coating the bottom and the sides of the openings 150, over the bond pads 124. The seed layer 106 may be Ti, TiW, TiWCu, Ta, TaN, or another titanium or tantalum alloy. The seed layer 106 may be deposited using evaporation, sputtering, or chemical vapor deposition (CVD).

Figure 6E:
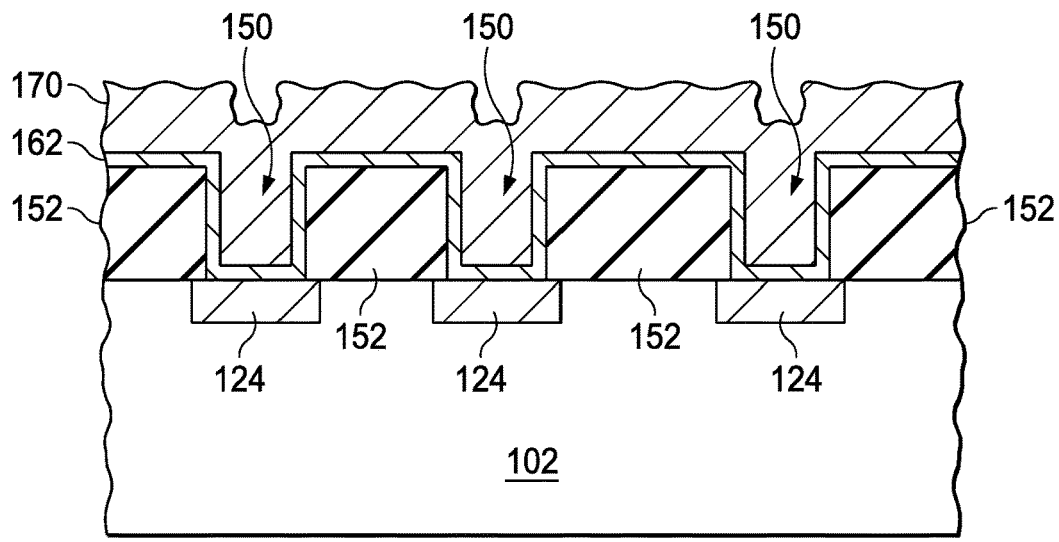

In the FIG. 6E, metal 170, for example a copper containing material, is plated, using the seed layer 106. The metal 170 fills the opening 150, and extends above the top surface of the seed layer 162 over the insulating material 152. The top surface of the metal 170 may have an irregular shape.

Figure 6F:
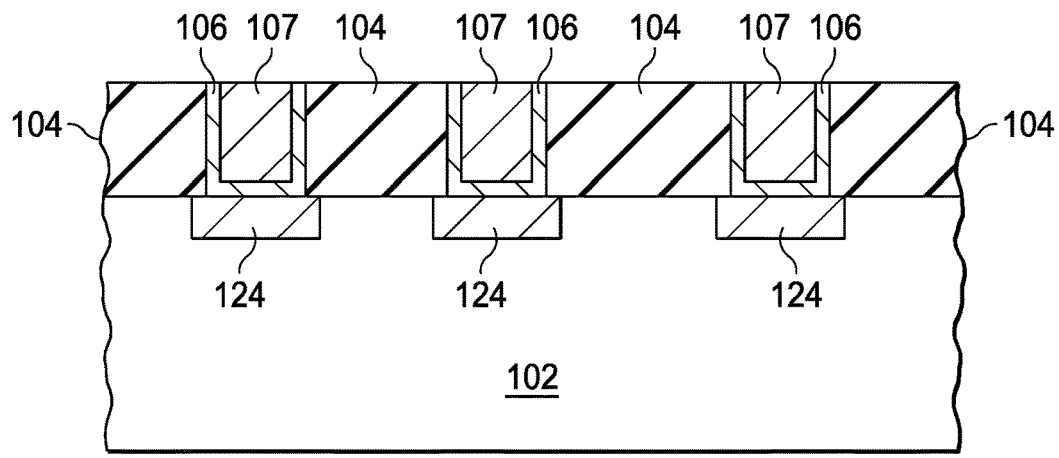

In the FIG. 6F, CMP is performed on the top portion of the metal 170 and the top portions of the seed layer 162 and the insulating material 152, to form a planarized surface. The semiconductor structure contains first metal layer structure, including first metal layer 107, lined by the seed layer 106. The first metal layer 107 and the seed layer 106 are electrically coupled to the bond pads 124. The insulating material 104 surrounds the first metal layer 107 and the seed layer 106. After the CMP, an ash cleaning is performed to remove any smeared copper at the surface. In at least one example, the insulating material 104 is replaced by a mold compound. In at least one example, before performing CMP, the semiconductor structure is attached to a stiff carrier, to reduce warpage.

Figure 6G:
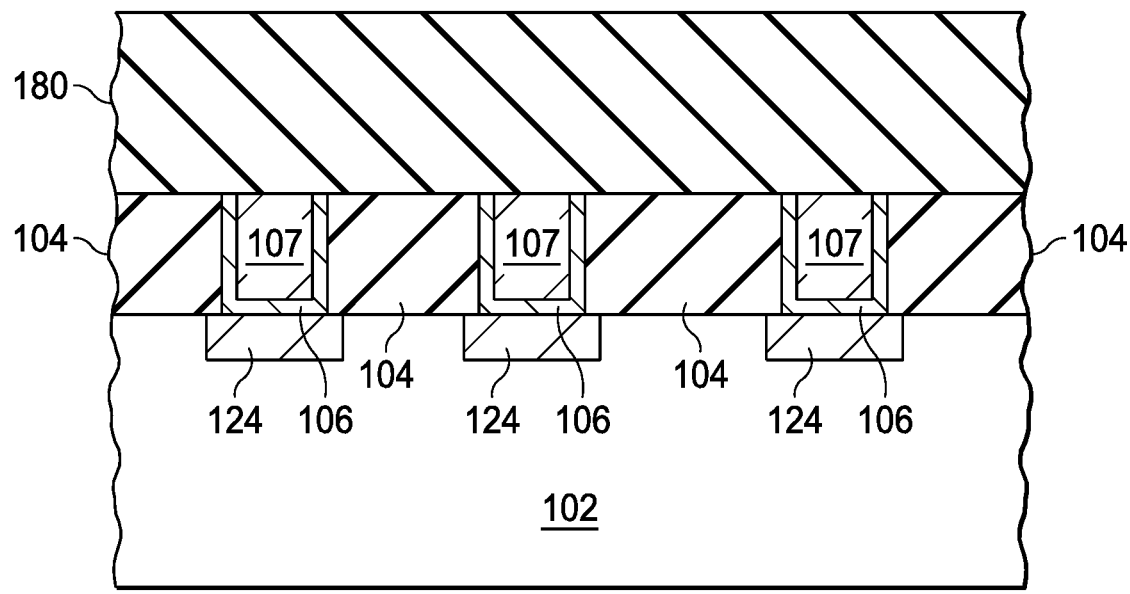

In the FIG. 6G, an insulating material 180 is applied over the planarized surface of insulating material 104, the first metal layer 107, and the seed layer 106. In one embodiment, the insulating material 180 is the same material as the insulating material 104, and it is applied in the same manner. Because of the planarized surface formed by the CMP step, a demarcation between the insulating material 180 and the insulating material 104 is present even when they are composed of the same material. In other examples, the insulating material 180 is composed of a different material than the insulating material 104. In at least one example, the insulating material is a polymer material. In at least one example, the insulating material 180 is a photosensitive material, for example a permanent resist such as SU-8. The insulating material 180 is an insulating material, for example between about 25 μm and about 300 μm.

Figure 6H:
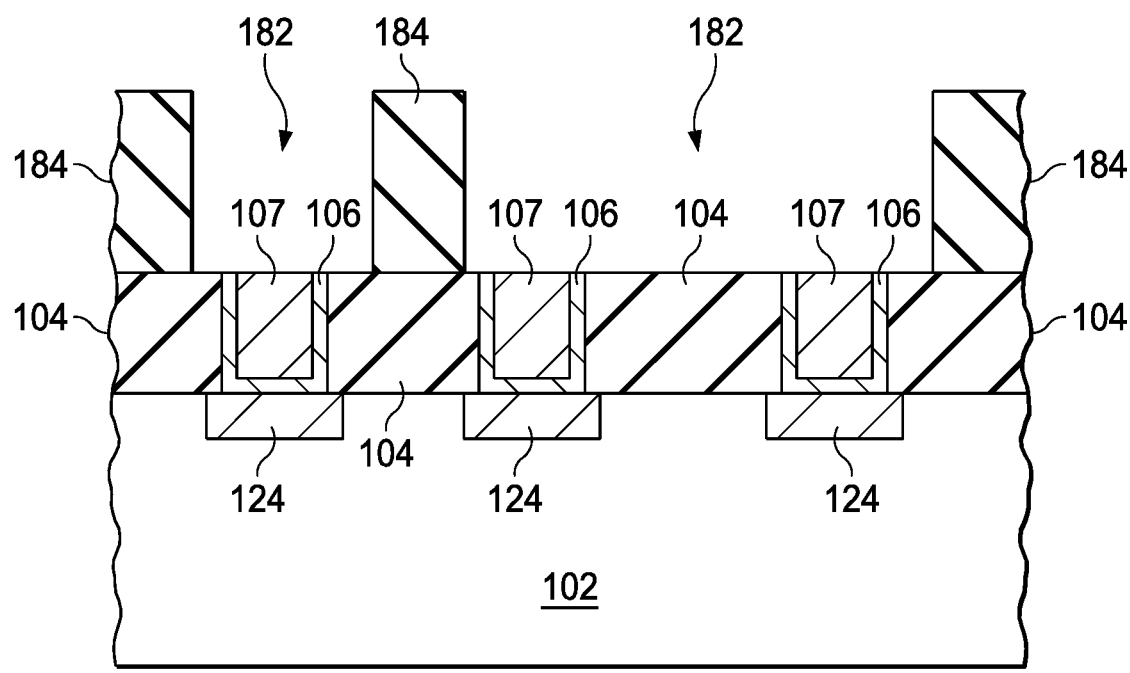

In FIG. 6H, openings 182 are formed in the insulating material 180, to produce insulating material 184. The openings 182 at least partially expose the top surface of the first metal layer 107. As pictured, one of the openings 182 fully exposes the top surface of one portion of the first metal layer 107 and one of the openings 182 fully exposes the top surfaces of two portions of the first metal layer 107. In at least one example, an opening may expose more portions of the first metal layer, for example three, four, five, or more portions of the first metal layer. The openings 182, as pictured, are wider than the first metal layer 107. In at least one example where the insulating material is a permanent photoresist.

Figure 6I:
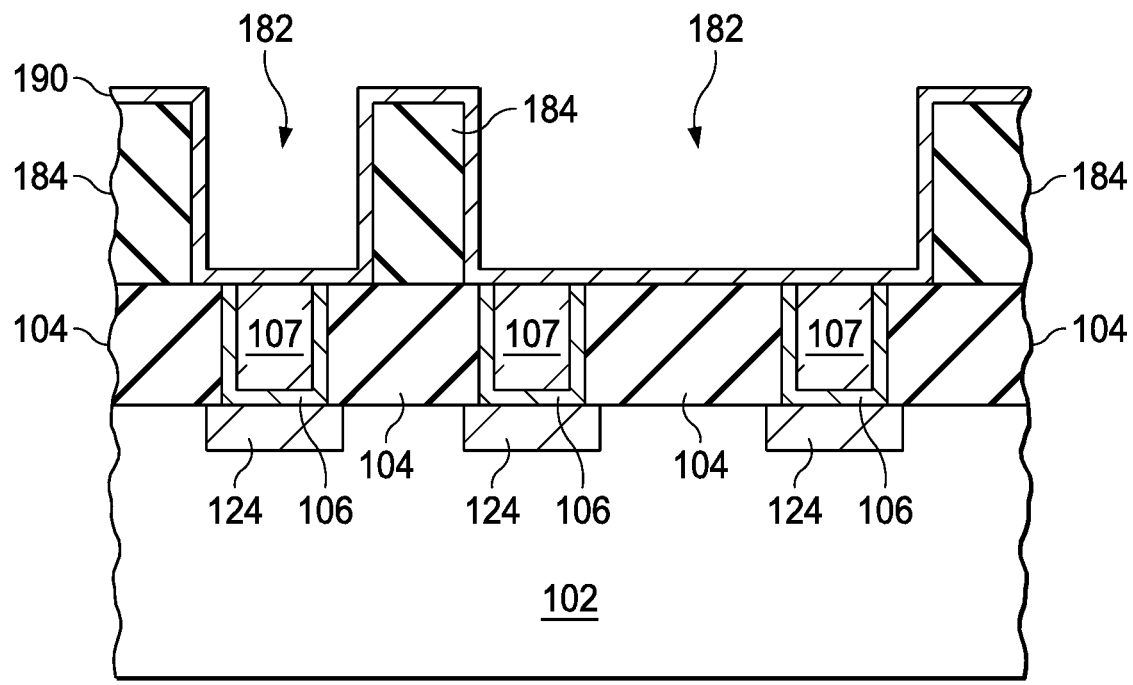

In FIG. 6I, a seed layer 190 is deposited over the insulating material 184, coating the bottom and the sides of the openings 182. The seed layer 190 may be Ti, TiW, Ta, TaN, or another titanium or tantalum alloy. The seed layer 190 may be deposited using evaporation, sputtering, or CVD. In at least one example, the seed layer 190 is less than 2 μm thick.

Figure 6J:
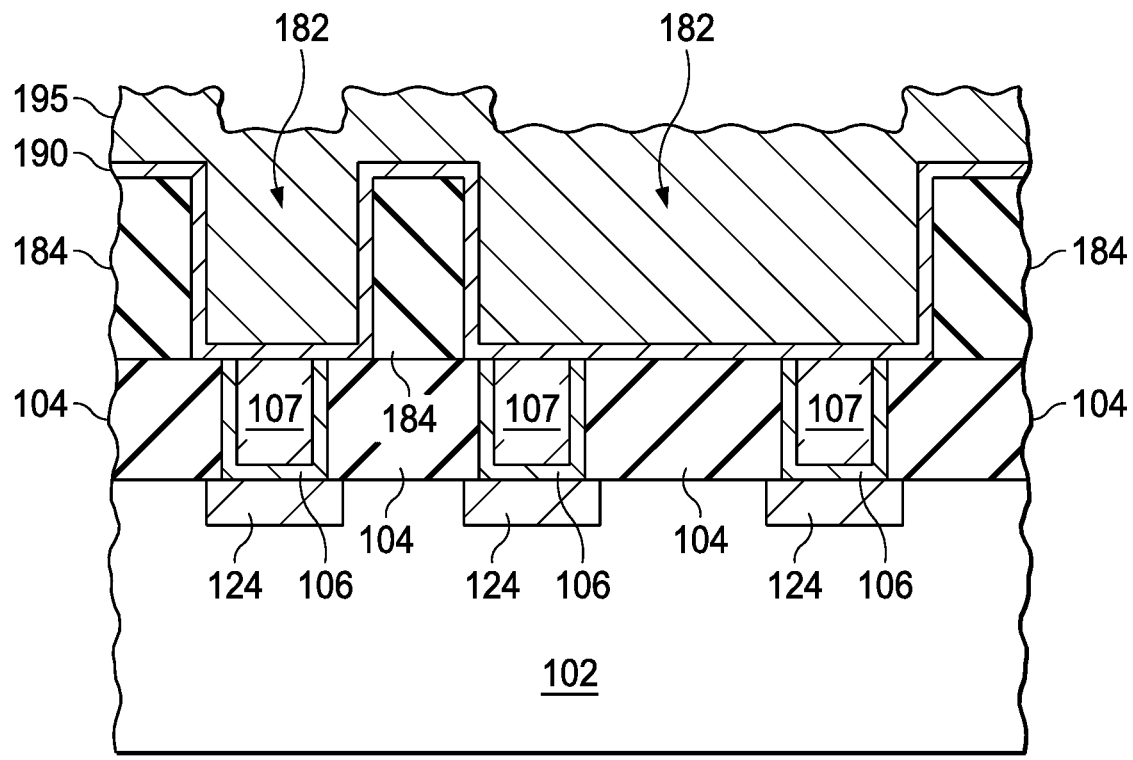

In FIG. 6J, a metal 195, for example a copper containing material, is deposited over the seed layer 190. The metal 195 fills the openings 182 and extends over the top surface of the insulating material 184 and the seed layer 190. The top surface of the metal 195 may be irregularly shaped.

Figure 6K:
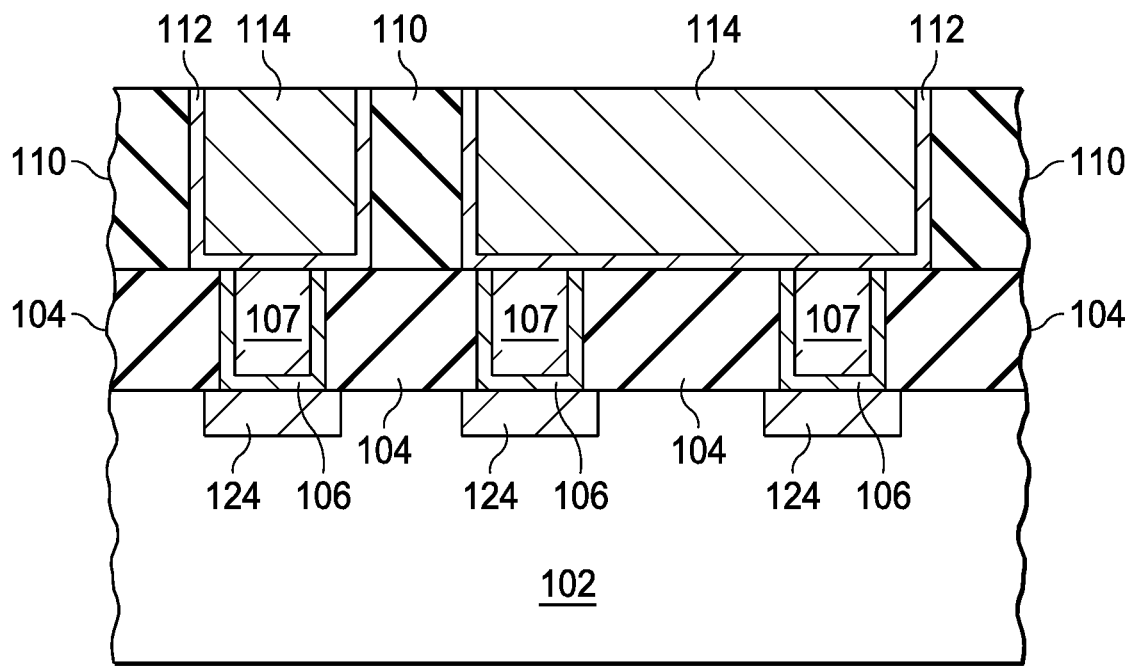

In FIG. 6K, CMP is performed on the top surface of the metal 195, the seed layer 190, and the insulating material 184, to produce a flat, planarized top surface. After performing CMP, an ash cleaning may be performed. In one embodiment, the insulating material is replaced by a mold compound. In one embodiment, both the insulating material 110 and the insulating material 104 are replaced in a single step.

Figure 6L:
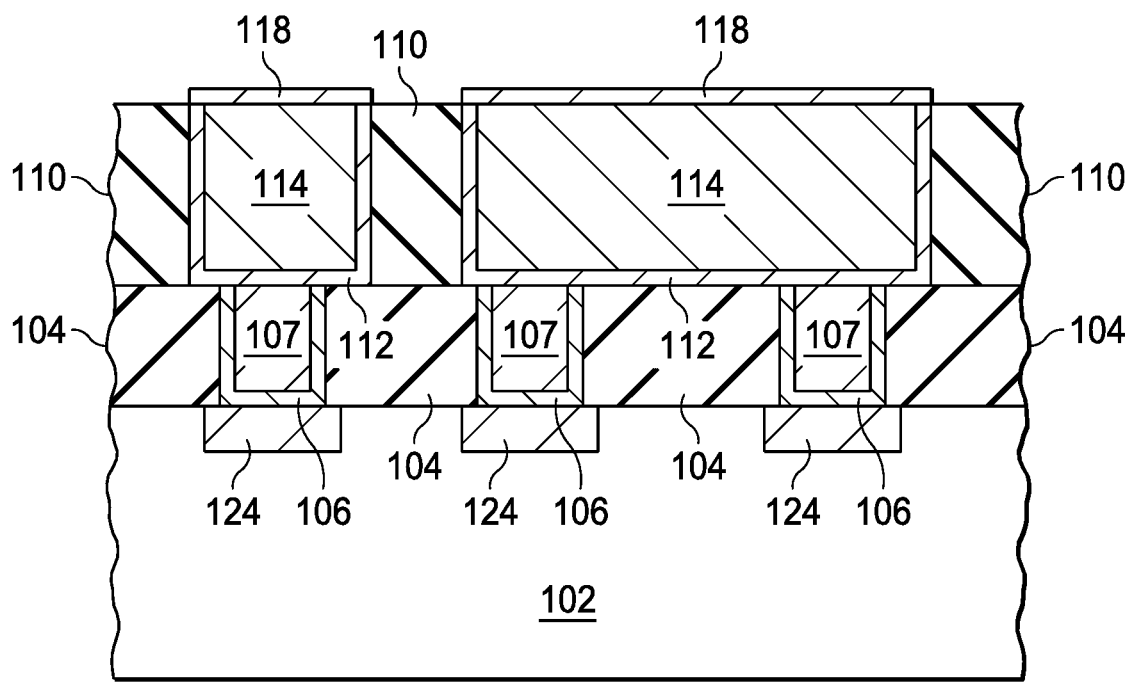

In FIG. 6L, a plate layer 118 is formed on the top, planarized surface of the second metal layer 114. In at least one example, the plate layer 118 is composed of NiSn, Sn, NiAg, NiPd, NiPdAu, NiAu, or another noble surface that is resistant to oxidation, such as ENIG, ENEG, or ENEPIG. The plate layer 118 protects the copper in the second metal layer 114 and provides robust solder joints with a PCB. Accordingly, the second metal layer 114 and the first metal layer 107 are enclosed by the plate layer 118, the seed layer 112, and the seed layer 106.

To form the semiconductor packaging structure 100 in FIG. 1 from the semiconductor structure illustrated in FIG. 6L, the substrate 102 is thinned and a back side coat 122 is applied to the surface of the substrate 102 opposite the surface that contains the bond pads 124. Before applying the back side coat 122, the substrate 102 is thinned, for example to a thickness 103 of between about 50 μm and about 500 μm. In at least one example, a carrier is removed before applying the back side coat 122. The back side coat 122 may be applied using spin coating or film attachment. The back side coat 122 may be between about 10 μm and about 60 μm. In at least one example, the back side coat 122 is an opaque material, for example black. Additionally, a symbol may be applied to the semiconductor packaging structure 100 (not pictured). Also, the semiconductor packaging structure 100 may be inspected. The wafer may be singulated, forming die. The plate layer 118 of the die may be attached to at least one PCB.

Figure 7A:
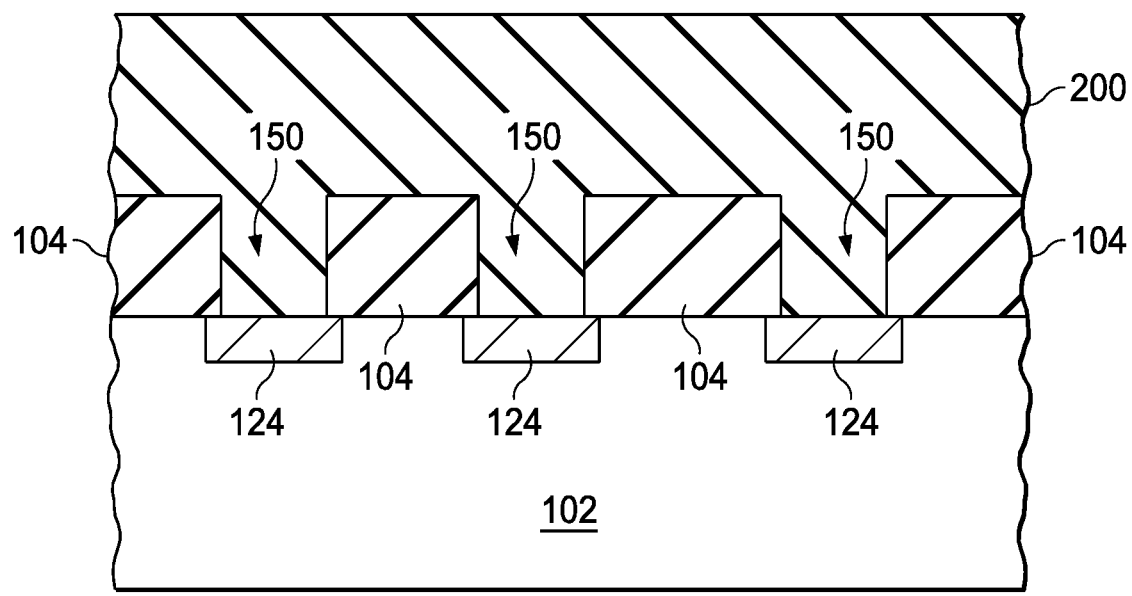
FIGS. 7A-G illustrate another example method of fabricating a semiconductor packaging structure.

FIGS. 7A-G illustrate another example method of fabricating a semiconductor packaging structure. The semiconductor structure illustrated in FIG. 7A is formed from the semiconductor structure illustrated in FIG. 6C. An insulating material 200 is deposited over the insulating material 104 and in the openings 150. The insulating material 200 may be composed of a polymer, which may be a photosensitive material, such as SU-8 or another permanent photoresist. The insulating material 200 is applied by spin coating or by lamination.

Figure 7B:
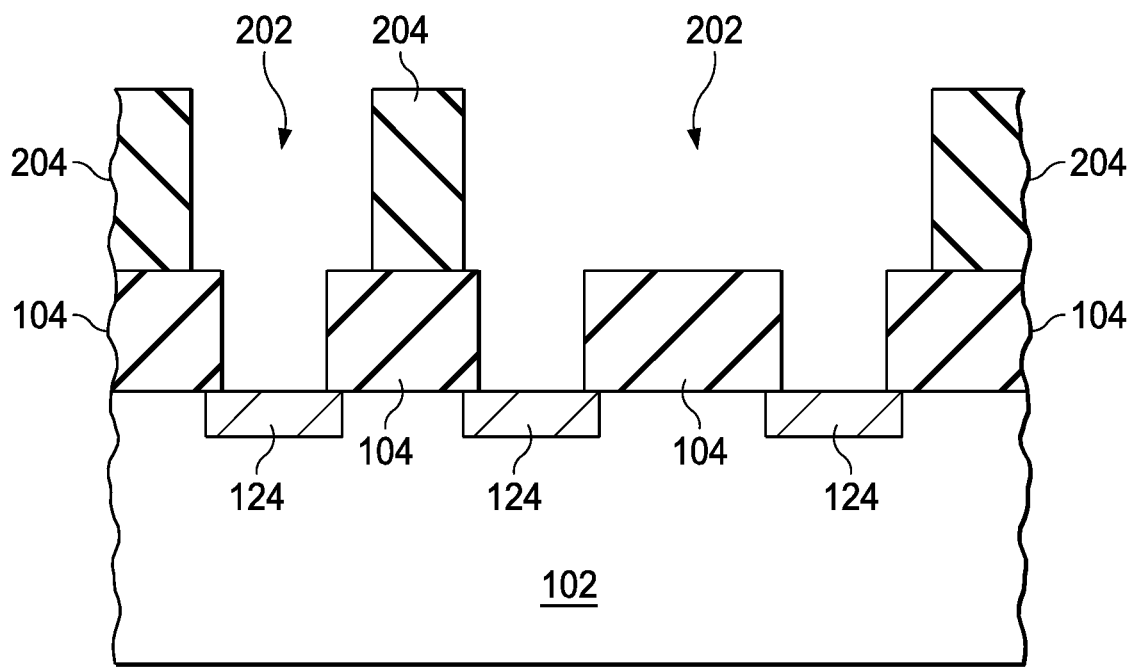

In FIG. 7B, a pattern is formed in the insulating material 200, forming openings 202 in the insulating material 204. The openings 202 expend through the insulating material 204 and the insulating material 104, exposing at least part of the bond pads 124. In at least one example where the insulating material 204 and 104 is a permanent photoresist, the pattern is formed by photolithography.

Figure 7C:
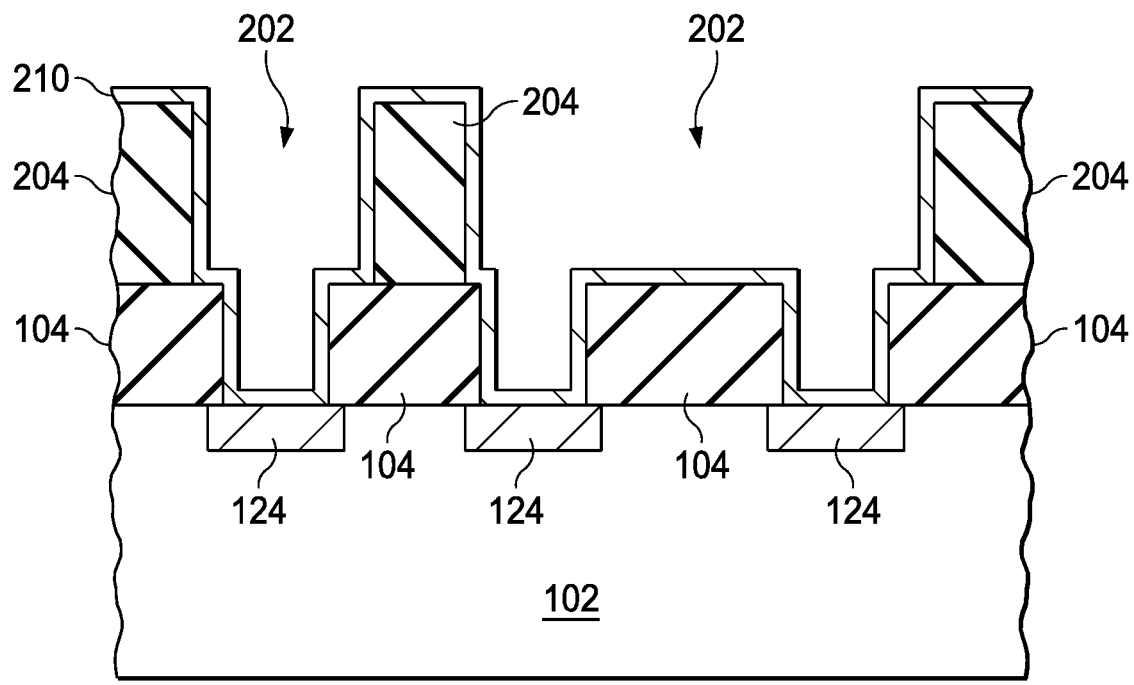

In FIG. 7C, a seed layer 210 is applied to the insulating material 204 and the insulating material 104, over the bond pads 124 and fully coating the openings 202. In at least one example, the seed layer 210, which may be Ti, TiW, Ta, TaN, or another titanium or tantalum alloy, is less than 2 μm thick. The seed layer 210 is deposited, for example, by evaporation, sputtering, or CVD.

Figure 7D:
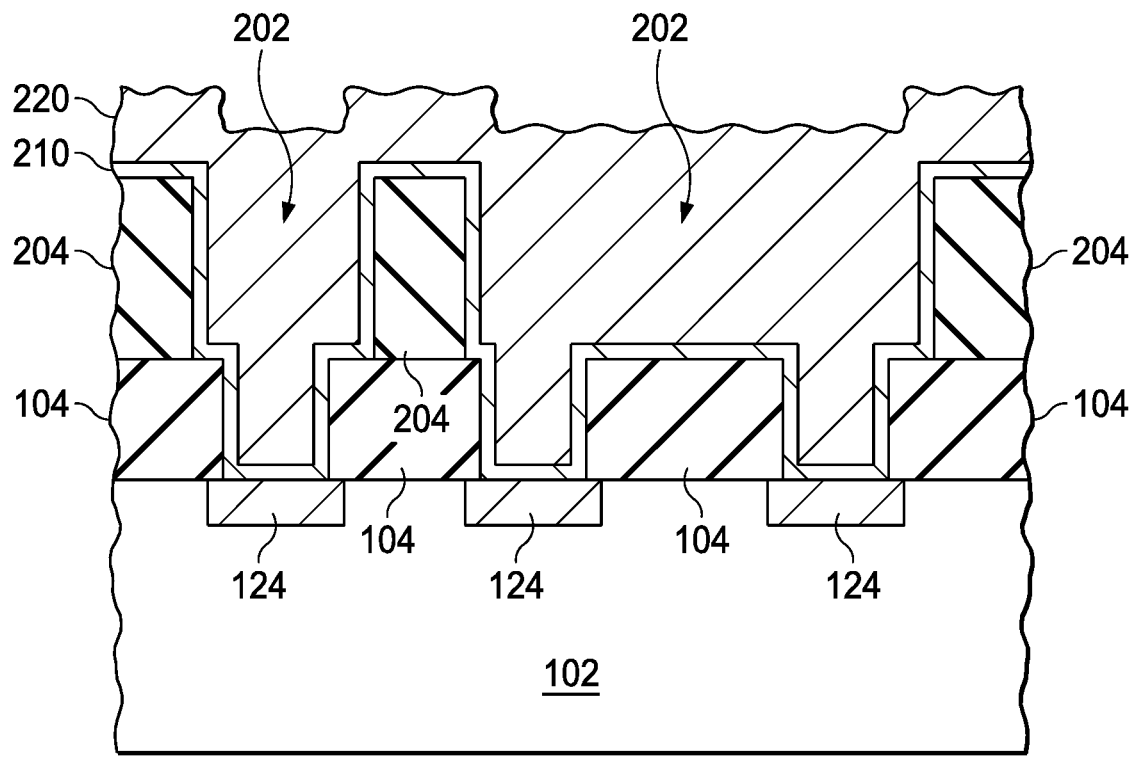

In FIG. 7D, metal 220, for example a copper containing material, is plated on the seed layer 210. The metal 220 fills the openings 202, and extends above the top of the insulating material 204 and the seed layer 210. The top surface of the metal 220 is irregular.

Figure 7E:
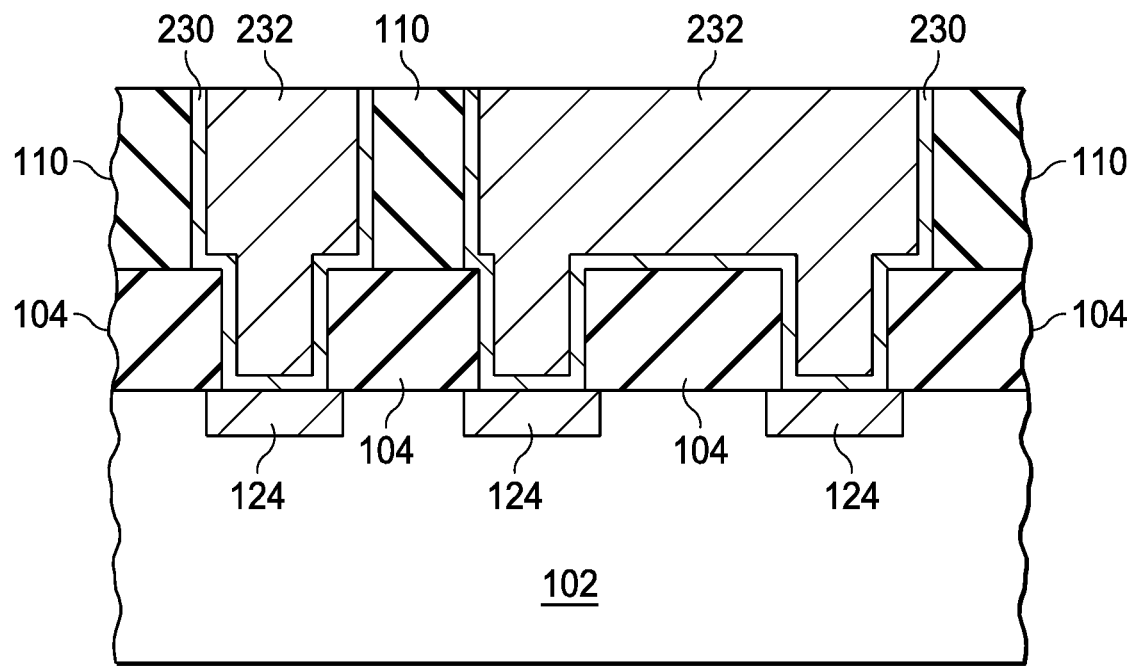

In FIG. 7E, a planarized top surface is formed by performing CMP on the top portion of the metal 220 and on the top portion of the seed layer 210, forming a seed layer 230 and metal layer 232. The metal layer 232 includes a second metal layer surround by the insulating material 110 and first metal layer surrounded by the insulating material 104, without a clear demarcation between these metal layers.

Figure 7F:
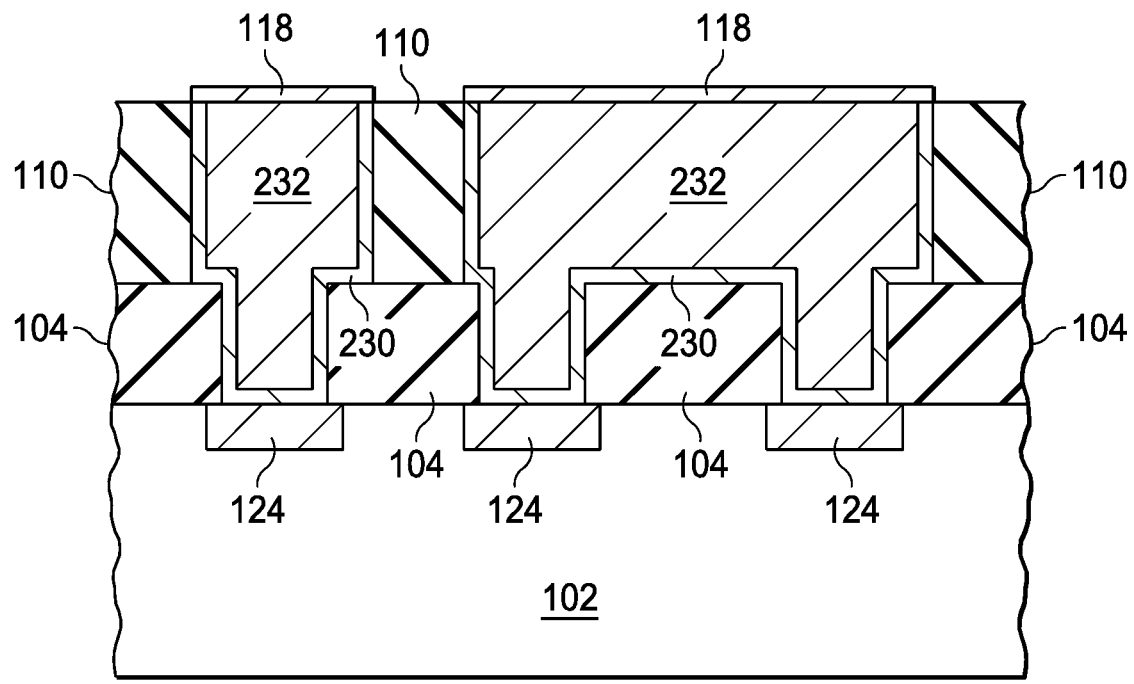

In the FIG. 7F, a plate layer 118, for example composed of NiSn, Sn, NiPd, NiAu, or NiPdAu, is formed on the top of the metal layer 232. In at least one example, the plate layer 118 is from about 2 μm thick to about 8 μm thick. The plate layer 118 may be applied using electroless plating. The plate layer 118 forms a solderable finish, which may be used to attach the semiconductor packaging structure to at least one PCB.

Figure 7G:
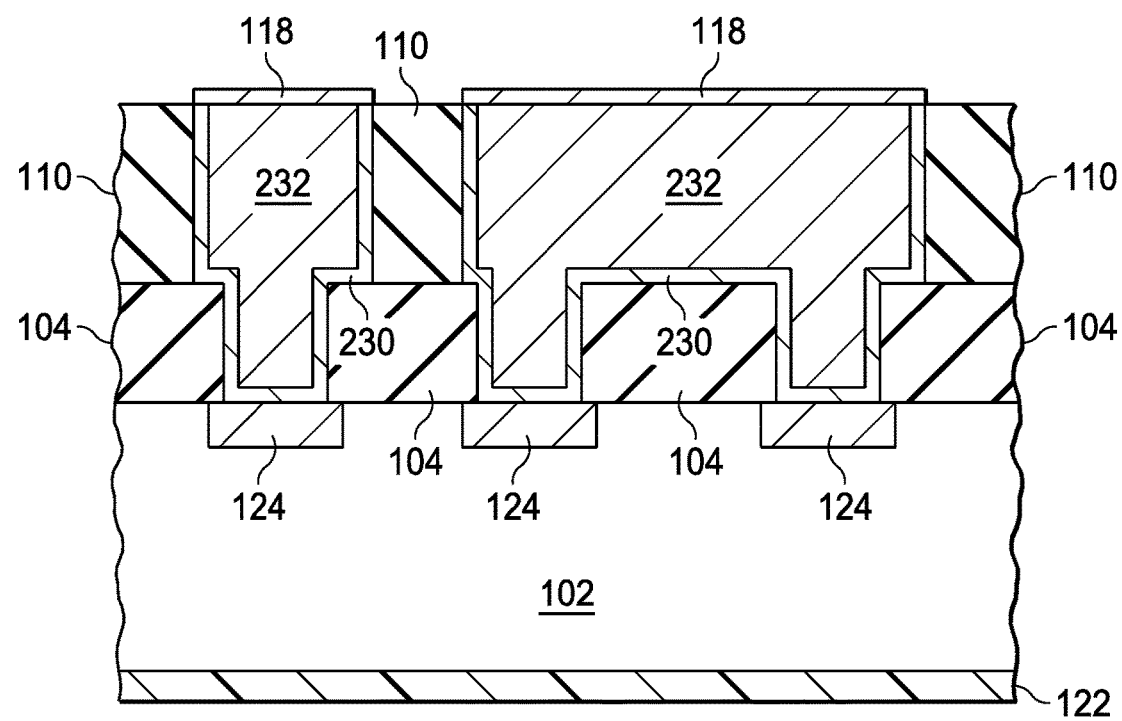

In FIG. 7G a back side coat 122, for example an opaque film, is formed on to the back side of the substrate 102. The back side coat 122 is formed on the surface of the substrate 102 opposite the surface containing the bond pads 124. In at least one example, the back side coat 122 is from about 10 μm to about 60 μm. The substrate 102 may be thinned before the back side coat 122 is applied. A semiconductor packaging structure in wafer form may be singulated, to produce a packaging structure.

Figure 8:
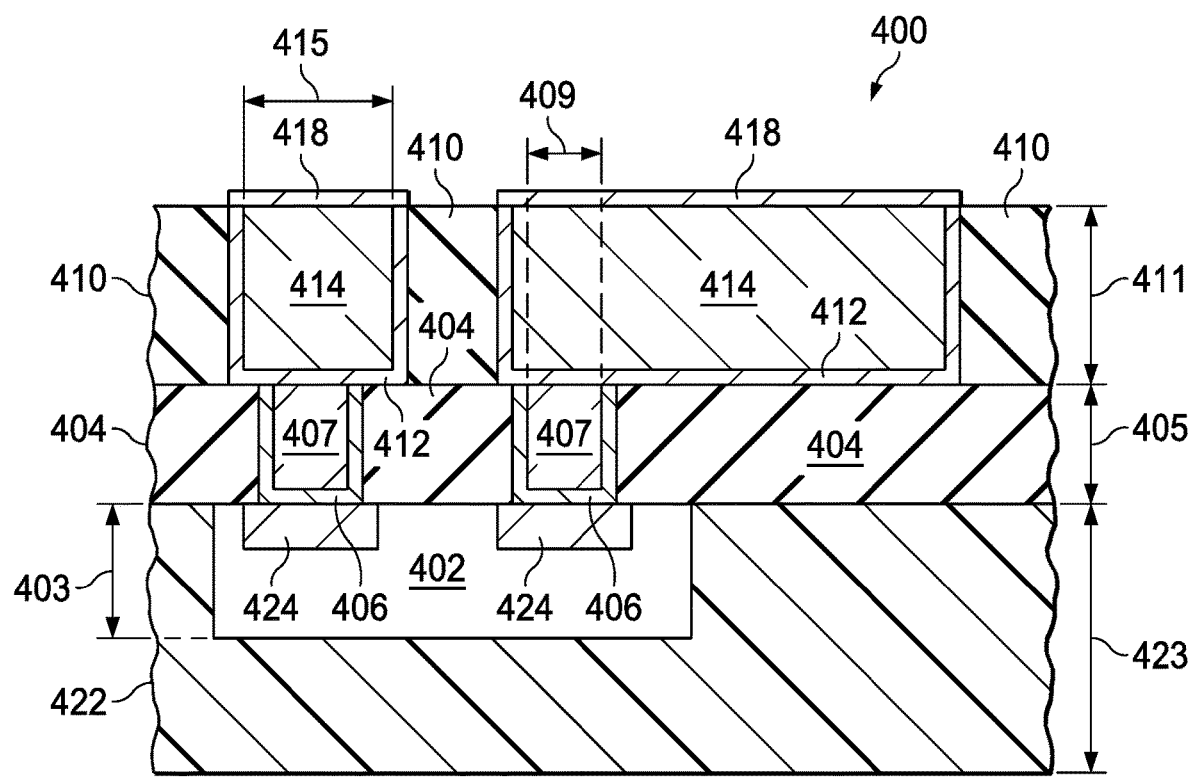
FIG. 8 illustrates a cross sectional view of another example semiconductor packaging structure.

In another embodiment, a die embedded in a mold compound forms a semiconductor packaging structure with multiple insulating and metal layers. FIG. 8 illustrates a semiconductor packaging structure 400 containing a semiconductor structure, such as a die 402 embedded in mold compound 422. In at least one example, the mold compound 422 is an opaque material, for example black. The die 402 contains at least one semiconductor device, for example at least one transistor, and bond pads 424. The die 402 has a thickness 403 of between about 50 μm and about 200 μm, and the mold compound 422 has a thickness 423 of between about 100 μm and about 700 μm.

Insulating material 404 is formed over the die 402 and over the mold compound 422. The insulating material 404 may have low moisture absorption, low modulus, and high adhesion. Additionally, the insulating material 404 is able to withstand the stresses of manufacturing and operation. In at least one example, the insulating material 110 is a polymer. The insulating material 404 may be a photosensitive material, such as a permanent photoresist, for example SU-8, Riston™, or another permanent photoresist, such as a permanent photoresist manufactured by TOK™, for example TMMR-S2000™ or TMMF-52000™. In at least one example, the insulating material 404 may be a material that is not photosensitive, such as a mold compound. In at least one example, the insulating material 404 has a thickness 405 of between about 5 μm and about 100 μm.

A first metal layer structure containing a first metal layer 407 and a seed layer 406 is disposed in openings of the insulating material 404. The first metal layer 407, the seed layer 406, and the insulating material 404, have a planarized top surface away from the die 402. The seed layer 406 may be composed of Ti, TiW, TiWCu, Ta, TaN, and may be less than 2 μm thick. The first metal layer 407, which may contain copper, extends through the insulating material 404 to couple to the bond pads 424 in the die 402 through the bottom portion of the seed layer 406. In at least one example, the first metal layer 407 has a width 409 of between about 25 μm and about 200 μm. The tall and narrow dimensions of the first metal layer 407 provide standoff thickness and flexibility to reduce micro-stresses. In at least one example, different portions of the first metal layers 407 within the semiconductor packaging structure 400 have different widths. In other examples, different portions of the first metal layer 107 within the semiconductor packaging structure 400 have similar, or the same, widths. As pictured, the first metal layer structure has straight sidewalls. In at least one example, the first metal layer structure has angled sidewalls, and are narrowing on the side of the die 402 and wider away from the die 402. The silicon in the die 402 is completely surrounded by the mold compound 422, the insulating material 404, and a first metal layer structure, including the seed layer 406 and the first metal layer 407.

The insulating material 410 is disposed on the planarized surface of the insulating material 404, the first metal layer 407, and the seed layer 406. The insulating material 410 contains a polymer, for example a photosensitive material, such as a permanent photoresist. In at least one example, the insulating material 410 is a mold compound. In one embodiment, the insulating material 410 is composed of the same material as the insulating material 404. The insulating material 410 may be distinguishable from the insulating material 404, even when they have the same composition, because of the planarized surface formed by a CMP step performed on the insulating material 404 before applying the insulating material 410. In at least one example, the insulating material 410 is composed of a different material than the insulating material 404. The insulating material 410 has a thickness 411 of between about 25 μm and about 300 μm. In at least one example, the thickness 411 of the insulating material 410 is greater than the thickness 403 of the insulating material 404. In at least one example, the thickness 411 is about the same thickness as the thickness 403, or the thickness 411 is less than the thickness 403.

The insulating material 410 contains a second metal layer structure, including a second metal layer 414 surrounded by a seed layer 412. The seed layer 412 may be composed of Ti, TiW, TiWCu, Ta, and TaN, and may be less than 2 μm thick. The second metal layer 414, which may contain copper, has a thickness 415 of greater than 150 μm. The second metal layer 414 extends beyond the edge of the die 402. Accordingly, the size of the external contacts may be large than the size of the die, facilitating current transfer and good contacts, while maintaining the small size of the die. This enables the miniaturization of the die while enabling the die to seamlessly couple to a larger PCB with low current density and low heat density. As pictured, the seed layer 412 lies between the second metal layer 414 and the first metal layer 407. However, in at least one example, the second metal layer 414 is disposed directly on the first metal layer 407. As pictured, the second metal layer 414 has straight sidewalls, but in at least one example it may have slanted sidewalls, being narrower on the die side and wider on the contact side. The second metal layer 414 provides mechanical and metallurgical strength. The second metal layer 414, seed layer 412, and the insulating layer 410 have a planarized top surface.

A plating layer 418 is disposed on the planarized surface of the second metal layer 414. The plating layer 418 extends beyond the edge of the die 402. The plating layer 418 is composed of a solderable material, such as NiSn, Sn, or a nickel or tin alloy. In at least one example, the plating layer 418 is a solderable metal stack, such as ENIG, ENEG, or ENEPIG. The plating layer 418 protects the copper in the second metal layer 414 and the copper in the first metal layer 407, and enables robust solder joints. The copper in the second metal layer 414 and the first metal layer 407 is completely surrounded by the seed layers 406 and 412, and by the plating layer 418. The plating layer 418, which has a thickness of about 2 μm to about 8 μm, extends beyond the top surface of the second metal layer 414 and the insulating material 410.

The semiconductor packaging structure 400 is pictured with two increasingly wide metal layer structures in insulating material, but more metal layer structures, for example three, four, or five metal layers, where each metal layer has wider features than the lower metal layer, may be present. A larger number of layers may facilitate coupling to very large connections.

At least one example may include additional layers, for example additional metal layers, for example copper over anything (COA) or additional polyimide or photoresist layers.

Figure 9:
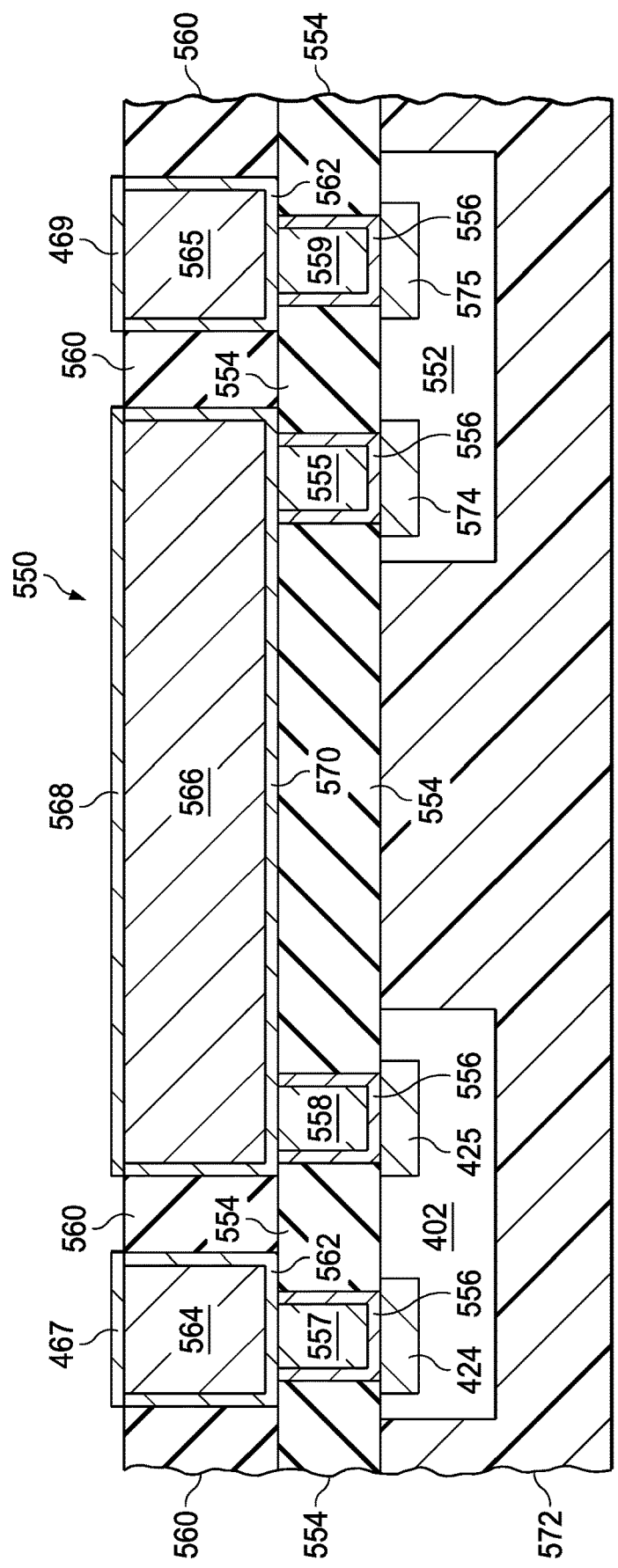
FIG. 9 illustrates a cross sectional view of an additional semiconductor packaging structure.

FIG. 9 illustrates a semiconductor packaging structure 550 with multiple die, a die 402 and a die 552. The die 402 and the die 552 are at least partially surrounded by mold compound 572. In at least one example, the mold compound 572 is an epoxy resin. The die 402 contains at least one semiconductor device, such as transistor, contacting the bond pads 424 and 425. Similarly, the die 552 contains at least one semiconductor device, such as at least one transistor, contacting bond pads 574 and 575.

Insulating material 554 is disposed over the mold compound 572 and the die 402 and 552, on the side of the bond pads 424, 425, 574, and 575. The insulating material 554 may be a polymer, for example a photosensitive polymer, such as a permanent resist. First metal layer structure include first metal layers 557, 558, 555, and 559 coated by a seed layer 556. The first metal layers 557, 558, 555, and 559, for example made of a copper containing material, extend through the insulating material 554 to the bond pads 424, 425, 574, and 575, respectively. The first metal layers 557, 558, 559, and 555 are pictured to be similarly sized, but in at least one example, the first metal layer 557 may have different sizes. The seed layer 556 is composed of Ti, TiW, TiWCu, Ta, TaN, or another titanium or tantalum alloy.

An insulating material 560 is disposed over the insulating material 554. In at least one example, the insulating material 560 is composed of the same material as the insulating material 554. In other examples, the insulating material 560 is composed of a different material than the insulating material 560. A second metal layer structure, including a second metal layer 564 and a second metal layer 565, with a seed layer 562 on the sides and on all or part of the bottoms, electrically couples the first metal layers 557 and 559 through the insulating material 560 to plating layers 467 and 469, respectively. Likewise, a second metal layer 566 is on the sides and all or part of the bottom of the second metal layer 564, 566, and 565 by the seed layer 570. The second metal layer 566 couples the first metal layers 558 and 555 to each other, and to the plating layer 568. Accordingly, the bond pad 425 in the die 402 is electrically coupled to the bond pad 574 in the die 552.

In at least one example, multiple die are present in a semiconductor packaging structure, but the die are not electrically coupled to each other through the packaging structure. For example, the second metal layer 566 is not present, and replaced by two second metal layers which separately couple the first metal layers 558 and 555 to separate plating layers, but do not electrically couple the first metal layer 558 to the first metal layer 555.

Figure 10A:
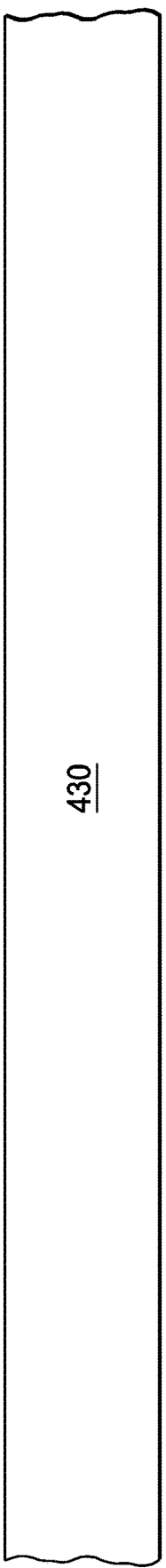
Figure 10B:
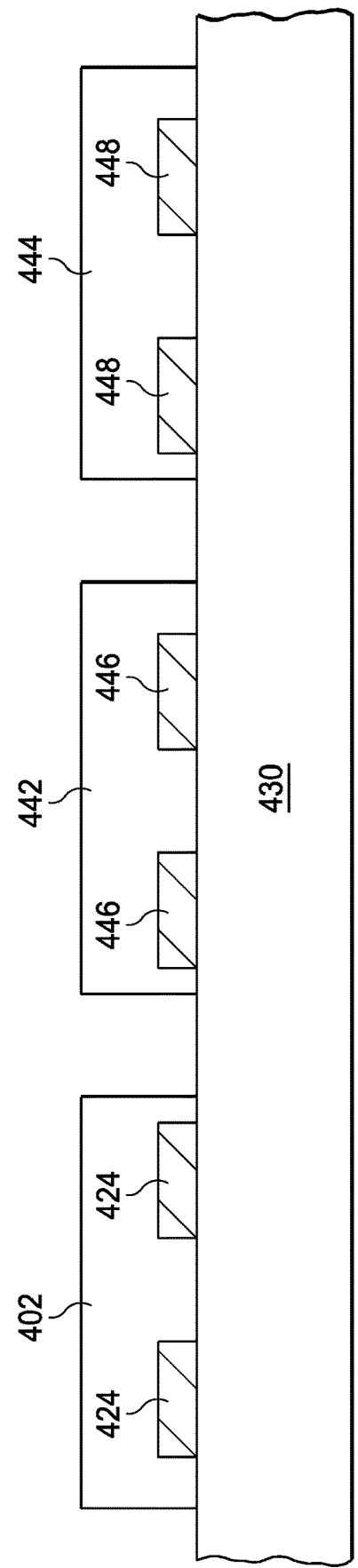
Figure 10C:
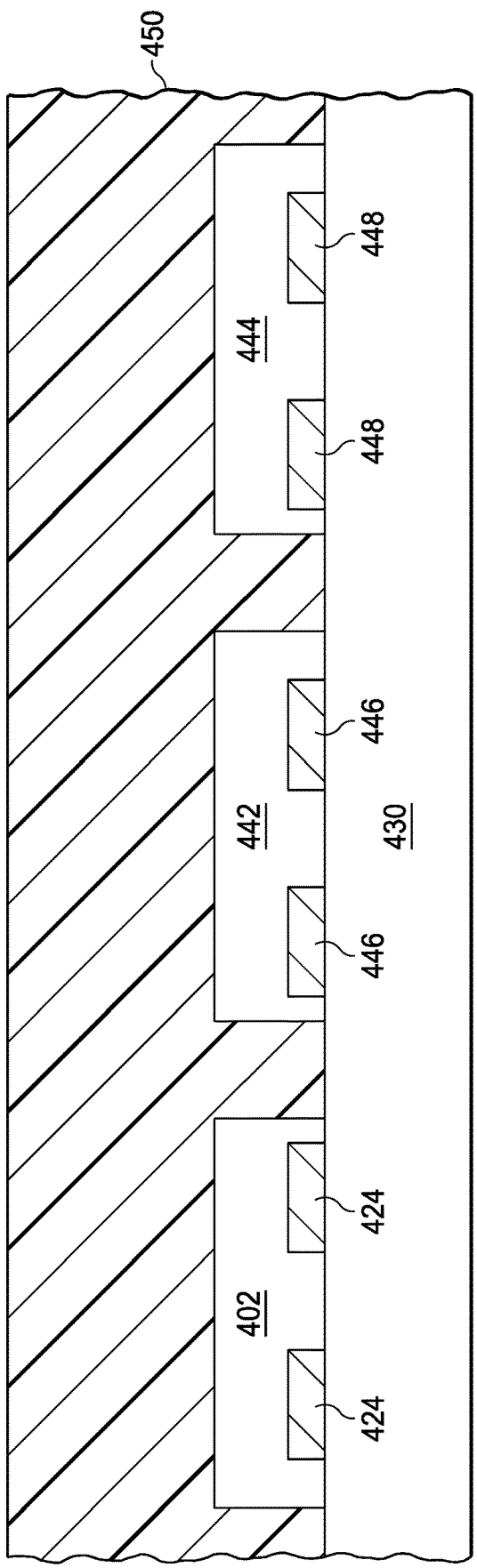
Figure 10D:
Figure 10E:
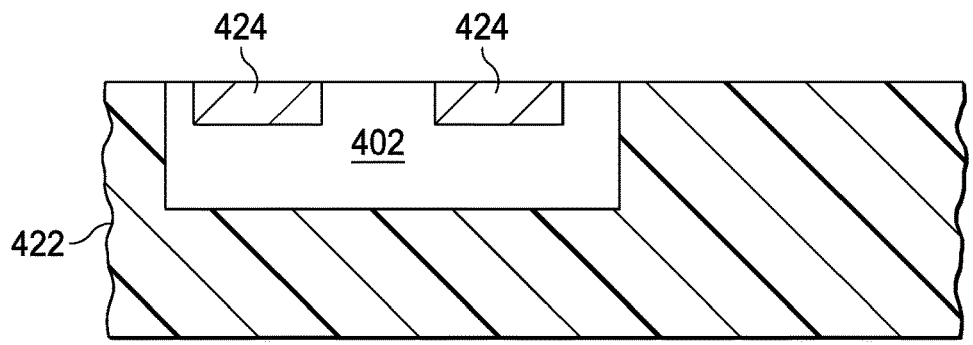
Figure 10F:
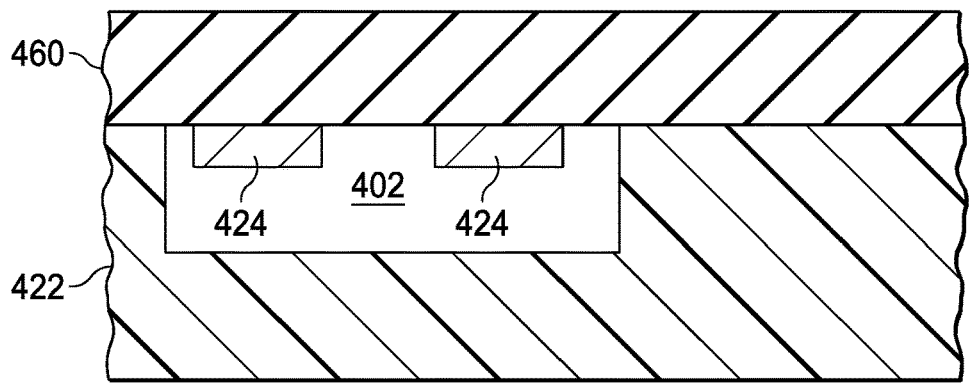
Figure 10G:
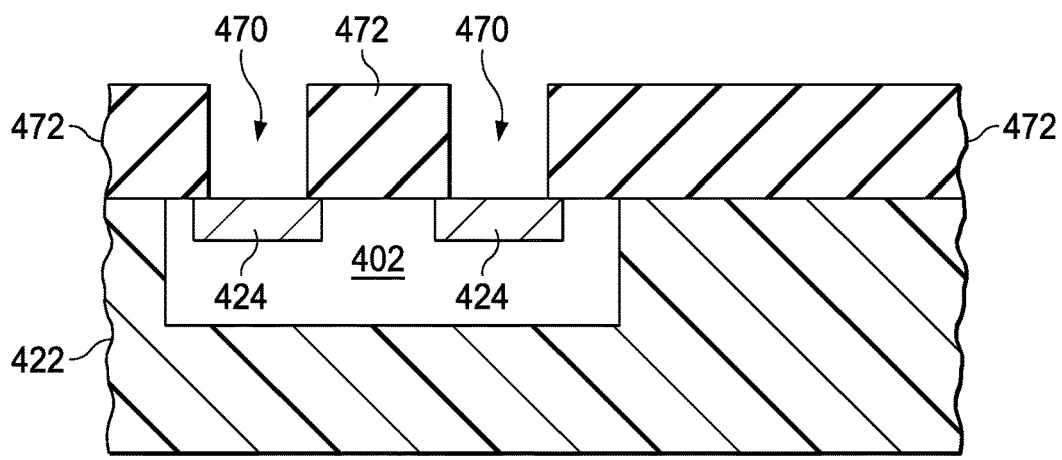
Figure 10H:
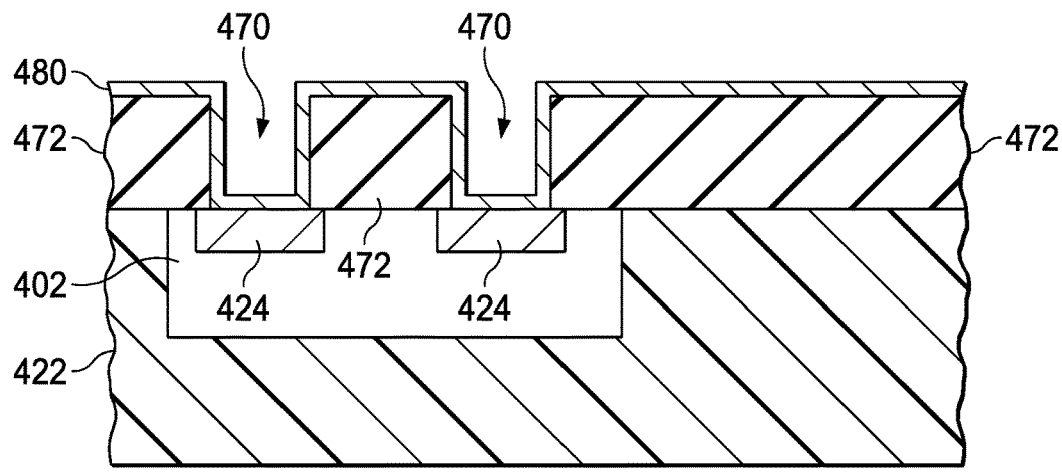
Figure 10I:
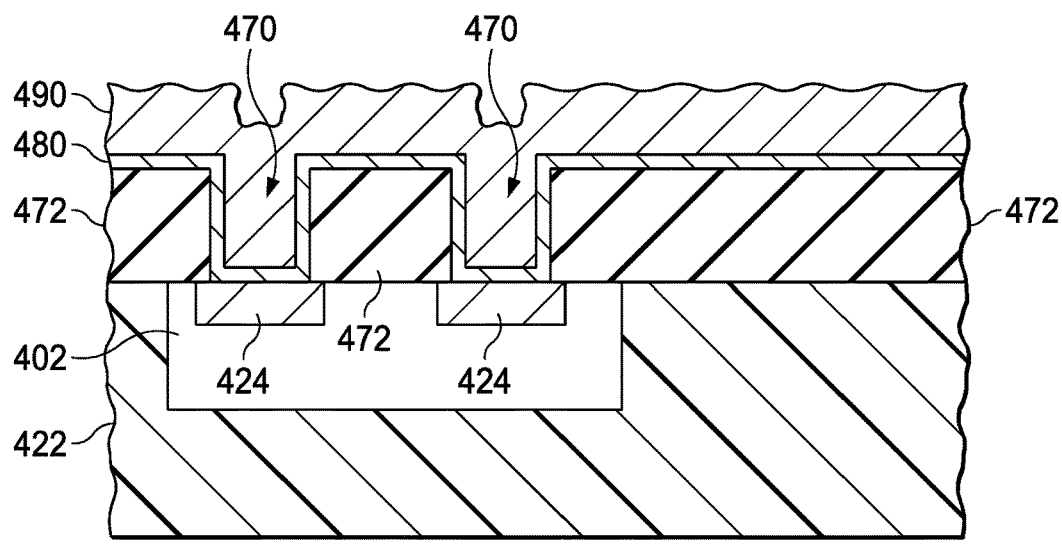
Figure 10J:
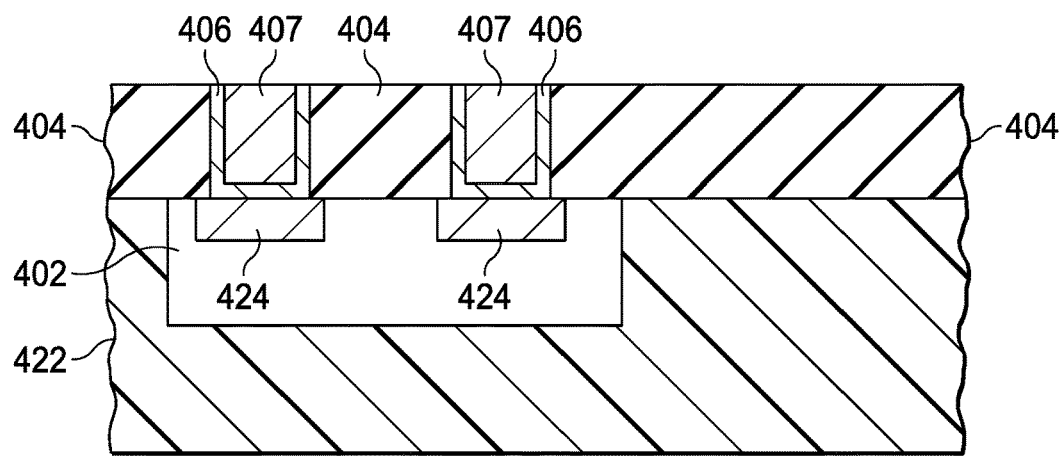
Figure 10K:
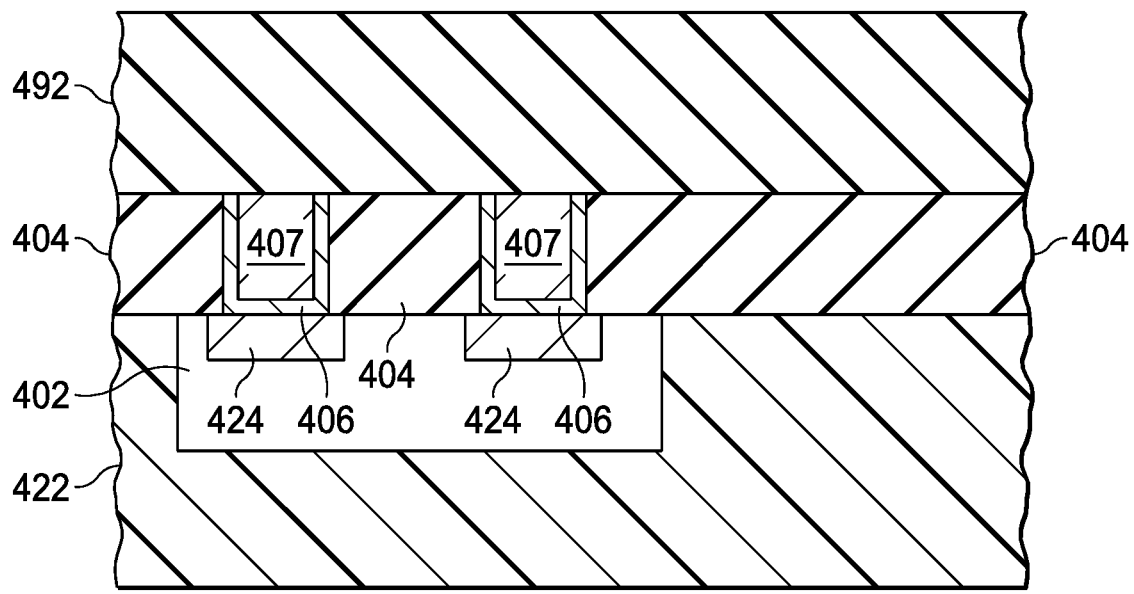
Figure 10L:
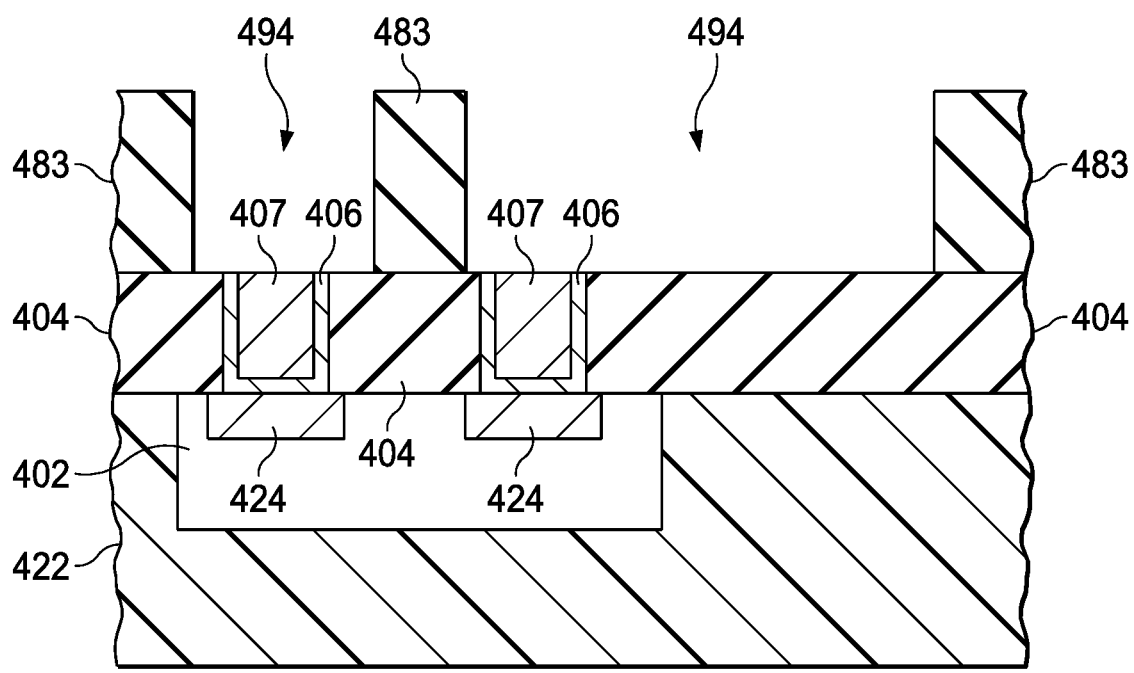
Figure 10M:
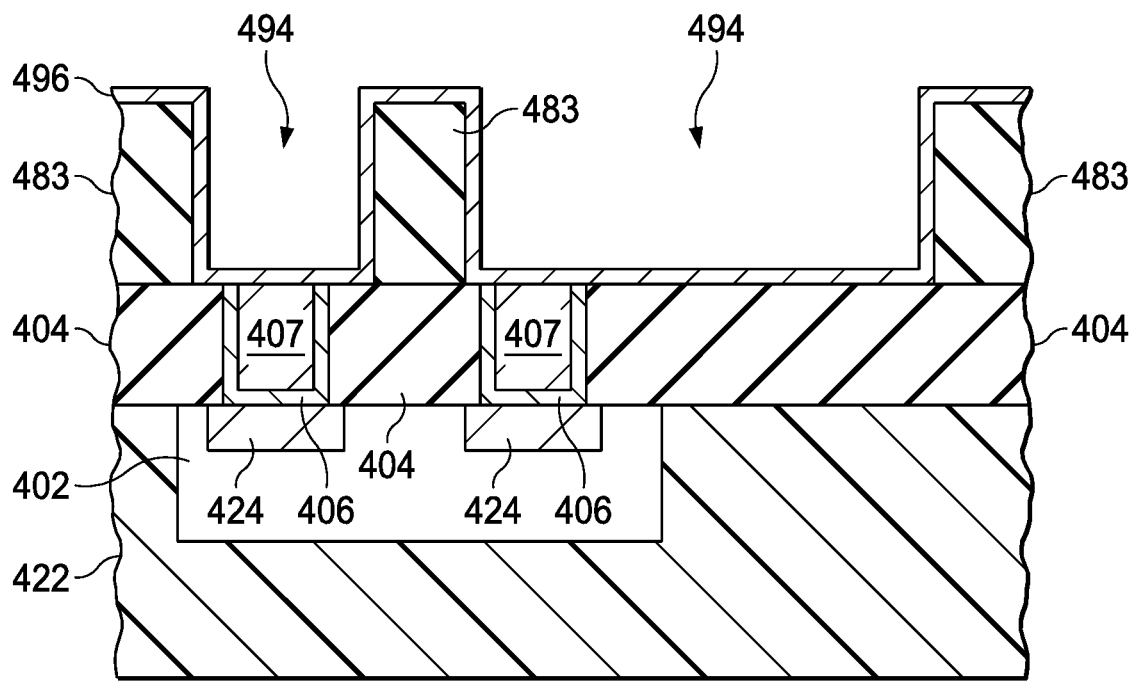
Figure 10N:
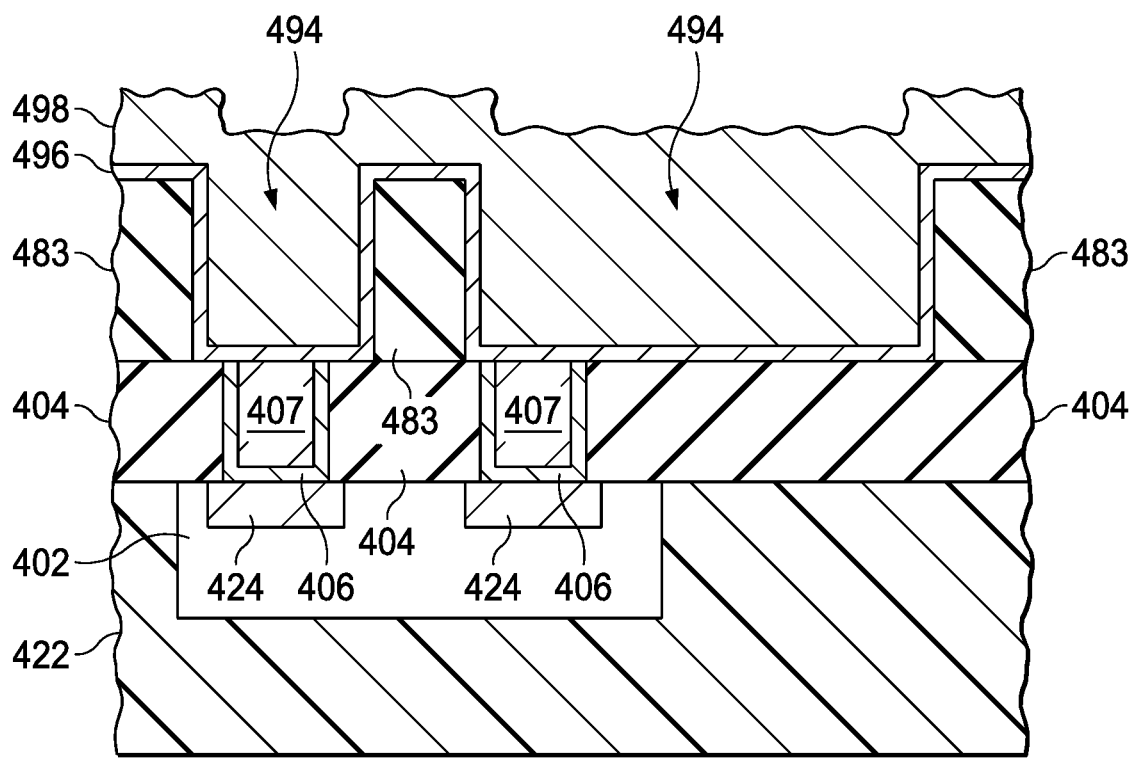
Figure 10O:
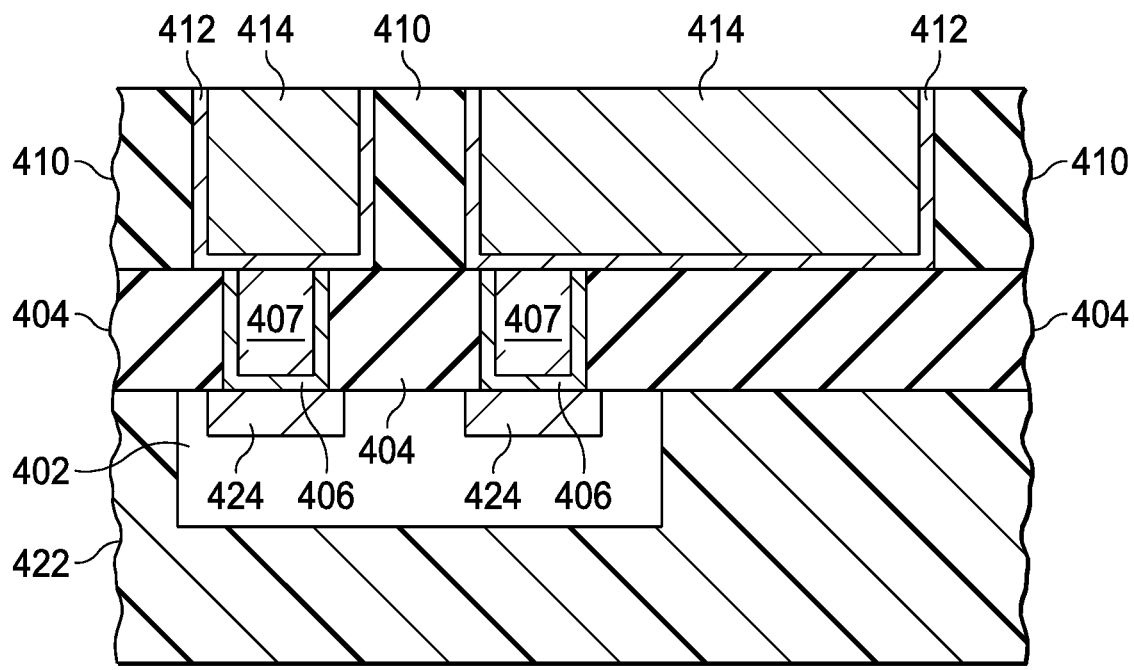

FIGS. 10A-O illustrate an example method of fabricating a semiconductor packaging structure, for example the semiconductor packaging structure 400 illustrated by FIG. 8. In FIG. 10A, a carrier 430 is obtained. The carrier 430 may be metal, such as a steel plate, a wafer, such as a silicon wafer, glass, a PCB panel, or an adhesive tape, such as polyvinyl chloride (PVC), polyolefin, or polyethelene.

In FIG. 10B, die 402, 442, and 444 are attached to the carrier 430. In at least one example, the die 402, 442, and 444 have been formed by thinning a wafer and singulating the wafer, to produce the die. In at least one example, for example when the carrier 430 is adhesive tape, the die 402, 442, and 444 are directly placed on the carrier 430. The die 402 is placed with bond pads 424 facing the carrier 430, the die 442 is placed with bond pads 446 facing the carrier 430, and the die 444 is placed with bond pads 448 facing the carrier 430.

In FIG. 10C, mold compound 450 is applied to the carrier 430 via transfer molding to at least partially cover the die 402, the die 442, and the die 444. Then, the system cures the mold compound to harden the mold compound. The mold compound 450 may be a plastic material, for example an epoxy resin, which, along with the carrier 430, surrounds the die 402, 442, and 444.

In FIG. 10D, the carrier 430 is removed, to generate a reconstituted wafer 451 containing the mold compound 450 and the die 402, 442, and 444. The active side of the die 402, 442, and 444, with the bond pads 424, 446, and 448, are exposed.

FIG. 10E depicts a portion of the reconstituted wafer 451 containing the mold compound 422 with the die 402, flipped, for clarity. While a single die is pictured for clarity, multiple die, such as die 442 and 444, or more die, may also be embedded in the mold compound 422.

In at least one example, a layer of polyimide is added over the die 402 and the mold compound 422, for example over at least some portions of the bond pads 424.

In FIG. 10F, the insulating material 460 is formed over the mold compound 422 and over the bond pads 424 on the die 402. The insulating material 460 is a thick polymer layer, for example between about 10 μm and about 100 μm thick. The insulating material 460 may be a photosensitive material, such as a permanent photoresist. In other examples, the insulating material 460 is a mold compound.

In FIG. 10G, openings 470 are formed in the insulating material 460 over the bond pads 424, forming the insulating material 472. The openings 470 may be formed by photolithography. In other embodiments, the openings 470 are formed by another method, such as laser etching or plasma etching. The openings 470 are pictured as being the same size, but they may be different sizes. Also, in at least one example, there may be more than two openings, for example three, for, five, six, seven, eight, nine, or more openings. The openings 470 are pictured as having straight sidewalls, but they may have sloped sidewalls, being narrower on the die side near the bond pads 424 and wider on the opposite side.

In FIG. 10H, a seed layer 480 is deposited over the insulating material 472, coating the bottom and the sides of the openings 470, including the bond pads 424. The seed layer 480 may be Ti, TiW, another titanium alloy, Ta, TaN, or another tantalum alloy. The silicon in the die 402 is fully surrounded by the molding compound 422, the insulating material 472, and the seed layer 480. The seed layer 480 acts as a barrier both to the die 402 and the first metal layer (not yet fabricated).

In FIG. 10I, a seed layer 480 is plated with the metal 490, for example a copper containing material.

In FIG. 10J, CMP is performed on the top surface of the metal 490, the seed layer 480, and the insulating material 472, to form a flat planarized surface in the semiconductor structure. The seed layer 406 surrounds the first metal layer 407 on the bottom and the sides, forming first metal layer structure with the top, planarized surface exposed. In at least one example, either before or after performing CMP, the insulating material 404 is replaced with a mold compound.

In FIG. 10K, insulating material 492 is formed on the top surface of the insulating material 404, the first metal layer 407, and the seed layer 406. The insulating material 492 may be the same material as the insulating material 404, or it may be a different material than the insulating material 404, for example another polymer material. Because of the planarized surface produced by the CMP step, the insulating material 492 may be distinguishable from the insulating material 404 even when they have the same composition. The insulating material 492 may be very thick, for example between about 50 μm and about 200 μm thick.

In FIG. 10L, openings 494 are formed in the insulating material 492, to form the insulating material 483. As pictured, the openings 494 have relatively straight sidewalls, but they may have angled sidewalls, being narrower on the die end near the first metal layer 407 and wider at the top. The first metal layer 407 may have various cross sections parallel to the bond pads 424, including an irregular shape, circular, oval, square, round, square, rectangular, or another polygon, for example a pentagon, hexagon, or octagon. In at least one example, there are more than two openings 494, for example three to ten openings. The openings 494 are pictured having different sizes, but they may have the same size or similar sizes.

In FIG. 10M, the seed layer 496 is deposited on the insulating material 483 and on the bottom and the sides of the openings 494, including over the first metal layer 407. The seed layer 496 may be for example, titanium, tantalum, a titanium alloy, or a tantalum alloy. The first metal layer 407 is completely surrounded by the seed layer 406 and the seed layer 496.

In FIG. 10N, the metal 498 is plated using the seed layer 496. The metal 498 may be a copper containing material.

In FIG. 10O, CMP is performed on the top portions of the metal 498, the seed layer 496, and the insulating material 483, to form a flat planar surface with the second metal layer 414, the seed layer 412, and the insulating material 483, in a semiconductor structure. Accordingly, the system forms second metal layer structure containing the second metal layer 414 and the seed layer 412. The second metal layer 414 extends beyond the edge of the die 402. The second metal layer 414 may have a variety of shapes. For example, the second metal layer 414 may have relatively straight sidewalls, or they may have sloped sidewalls, to be narrower by the first metal layer 407 and wider at the top. The second metal layer 414 may have various cross sections in the lateral direction, including irregular, circular, oval, square, rounded square, rectangular, or another polygon, for example a pentagon, hexagon, or octagon. In other examples, the second metal layer 414 has a variable shape, or an irregular shape.

To form the semiconductor packaging structure 400 in FIG. 8 from the semiconductor structure illustrated in FIG. 10O, the plate layer 418 is applied to the second metal layer 414 using electroless plating. The plate layer 418 may be composed of NiSn, ENIG, Sn, ENEPIG, ENEG, or another solderable material. The plate layer 418 extends beyond the edge of the die 402. The second metal layer 414 is fully surrounded by the seed layer 412 and the plating layer 418, preventing silicon migration. The singulation is performed after applying the plate layer 418, to form separate semiconductor packing structures. The semiconductor packaging structure 400 may then be attached to a PCB by the plating layer 418.

Figure 11A:
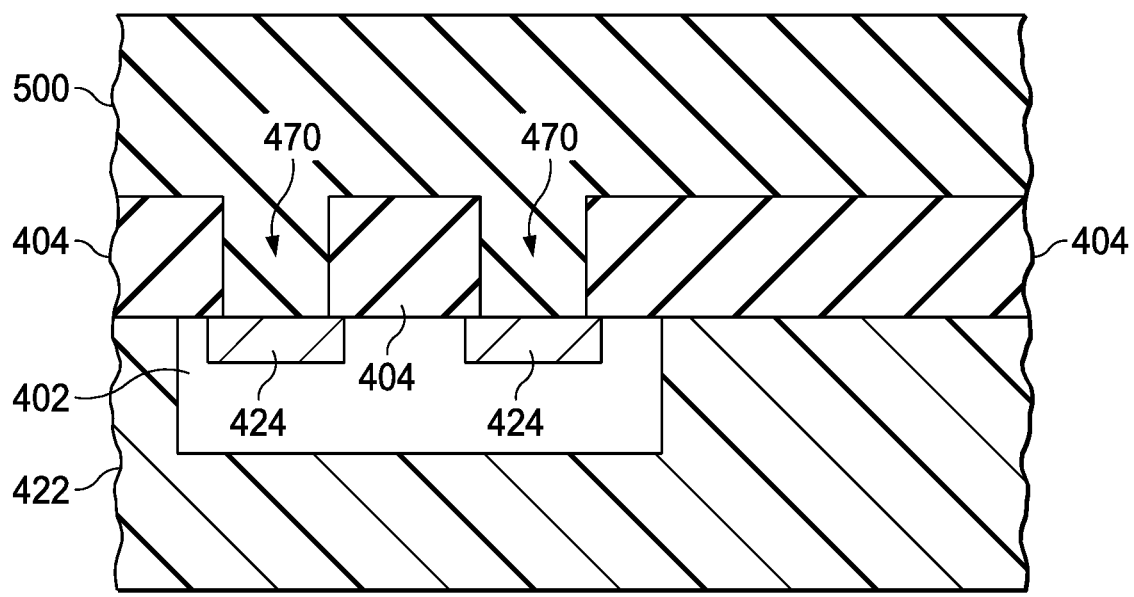
FIGS. 11A-F illustrate another method of fabricating a semiconductor packaging structure.

FIGS. 11A-F illustrate another example method of fabricating a semiconductor packaging structure containing a die. In FIG. 11A, the insulating material 500 is formed over the insulating material 404 and in the openings 470 of the semiconductor structure, illustrated in FIG. 10G. The insulating material 500 may be a polymer, such as a permanent photoresist, having a thickness of between about 50 μm and about 250 μm. The insulating material 500 may be the same material as the insulating material 404. In other examples, the insulating material 500 is a different material than the insulating material 404, for example another polymer material.

Figure 11B:
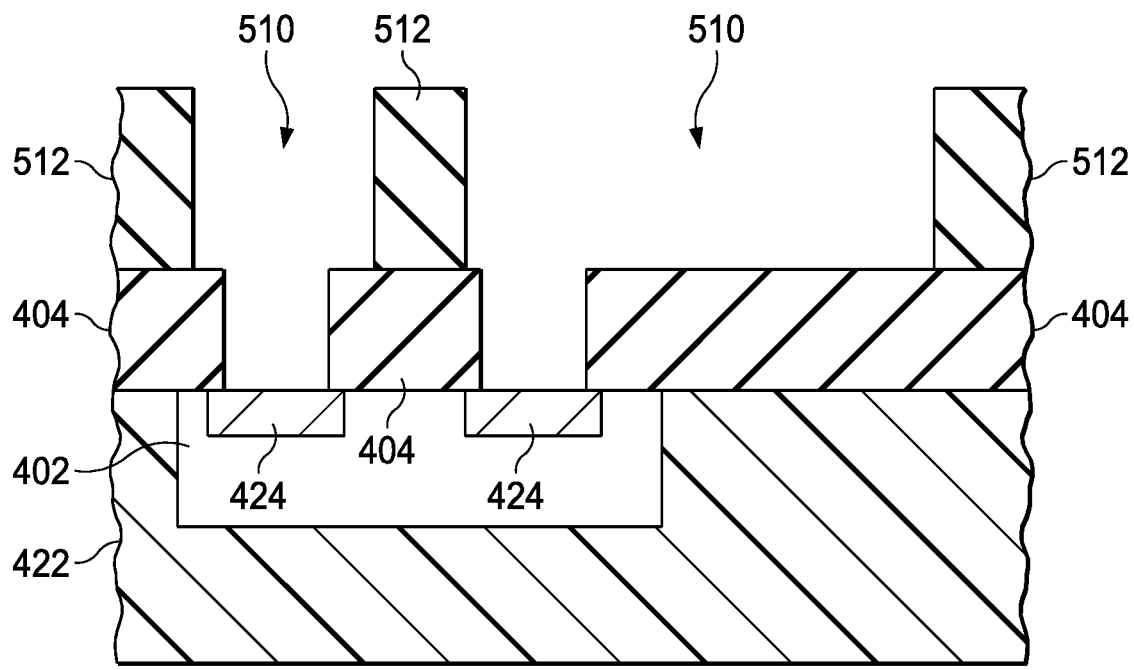

In FIG. 11B, openings 510 are formed in the insulating material 500, forming the insulating material 512. The openings 510 extend through the insulating material 512 and the insulating material 404 to the bond pads 424. When the insulating material 500 is a photosensitive material, the openings 510 may be formed by exposing the insulating material 500 using a photolithography mask, developing the insulating material 500, and curing the insulating material 500. In other examples, the openings 510 are formed by plasma etching or laser etching.

Figure 11C:
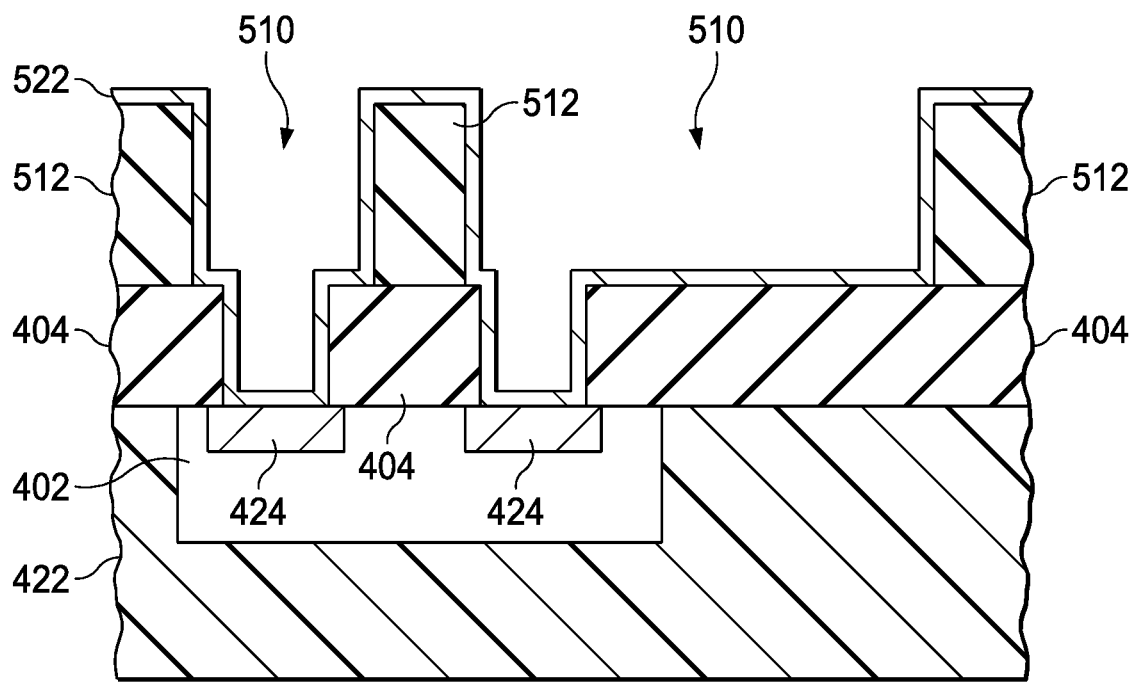

In FIG. 11C, a seed layer 520 is formed on the insulating material 512, coating the openings 510 and contacting the bond pads 424. The seed layer 520 is formed by sputtering or evaporation, to fully coat the insulating material 512. The seed layer 522 provides a barrier, and may be, for example, composed of titanium, tantalum, a titanium alloy, or a tantalum alloy. The die 402 is completely surrounded by the mold compound 422, the insulating material 404, and the seed layer 522.

Figure 11D:
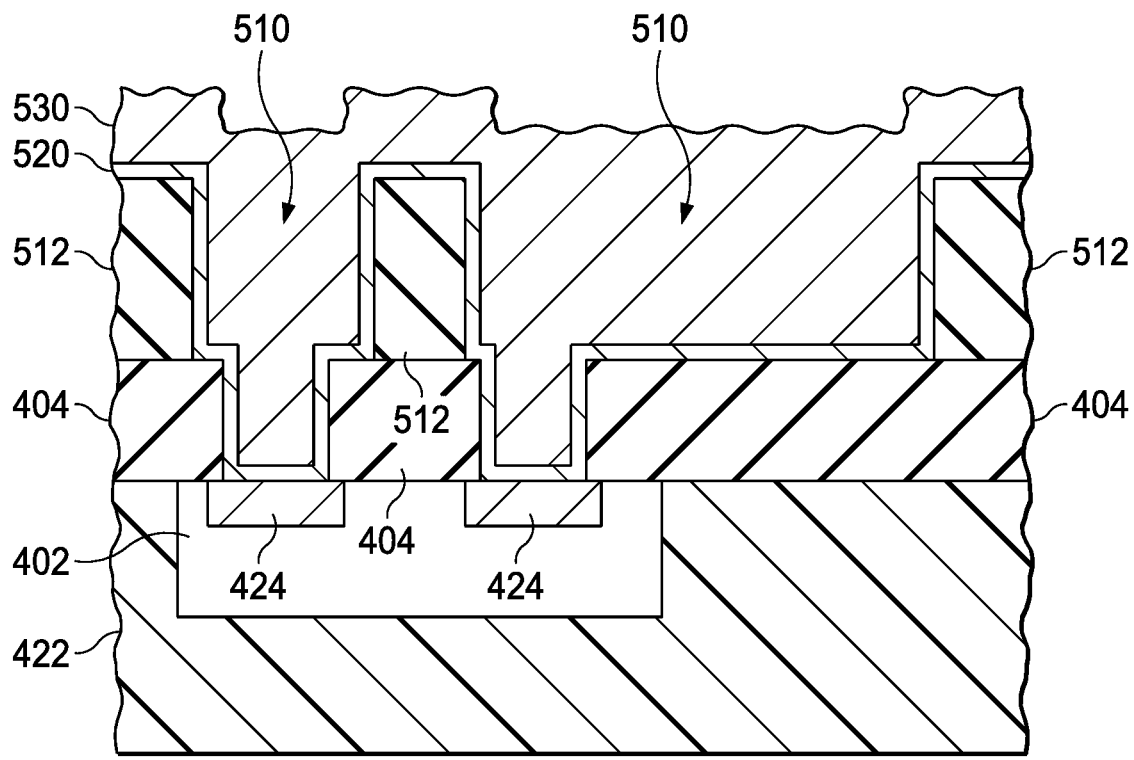

In FIG. 11D, metal 530, for example a copper containing material, is plated using the seed layer 520.

Figure 11E:
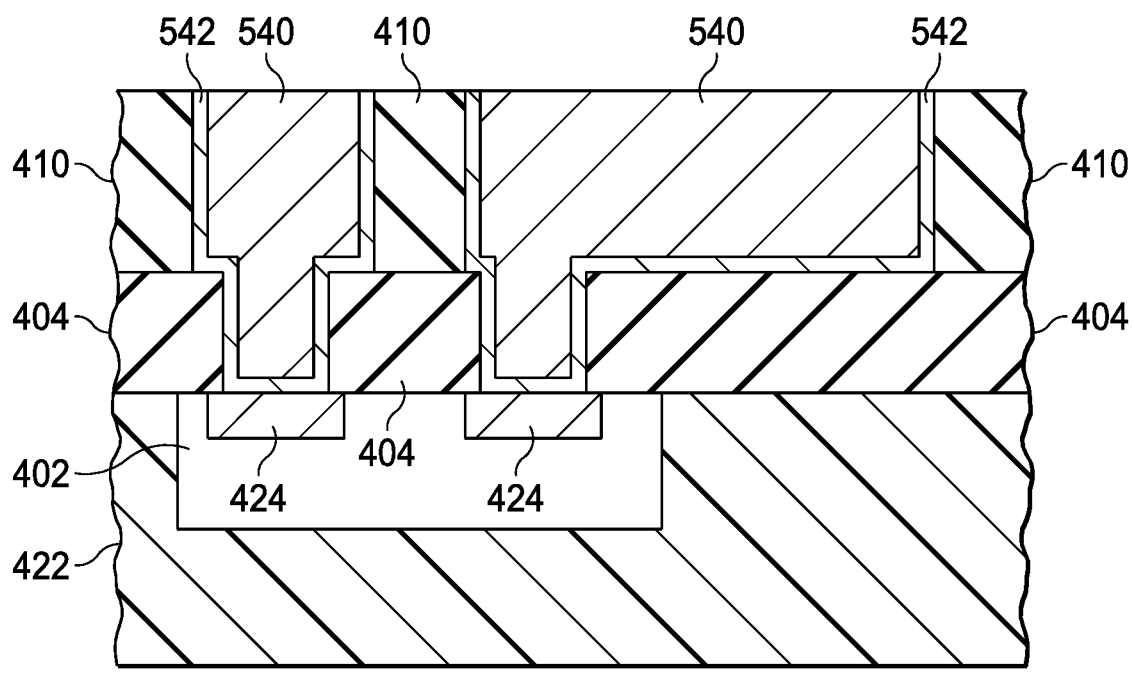

In FIG. 11E, CMP is performed, to produce a flat, planarized top surface, by removing the top portion of the metal 530, the insulating material 512, and the seed layer 520. Accordingly, the metal layer 540, including a second metal layer and first metal layer, coated with the seed layer 542 is formed. The metal layer 540 extends laterally beyond the edge of the die 402.

Figure 11F:
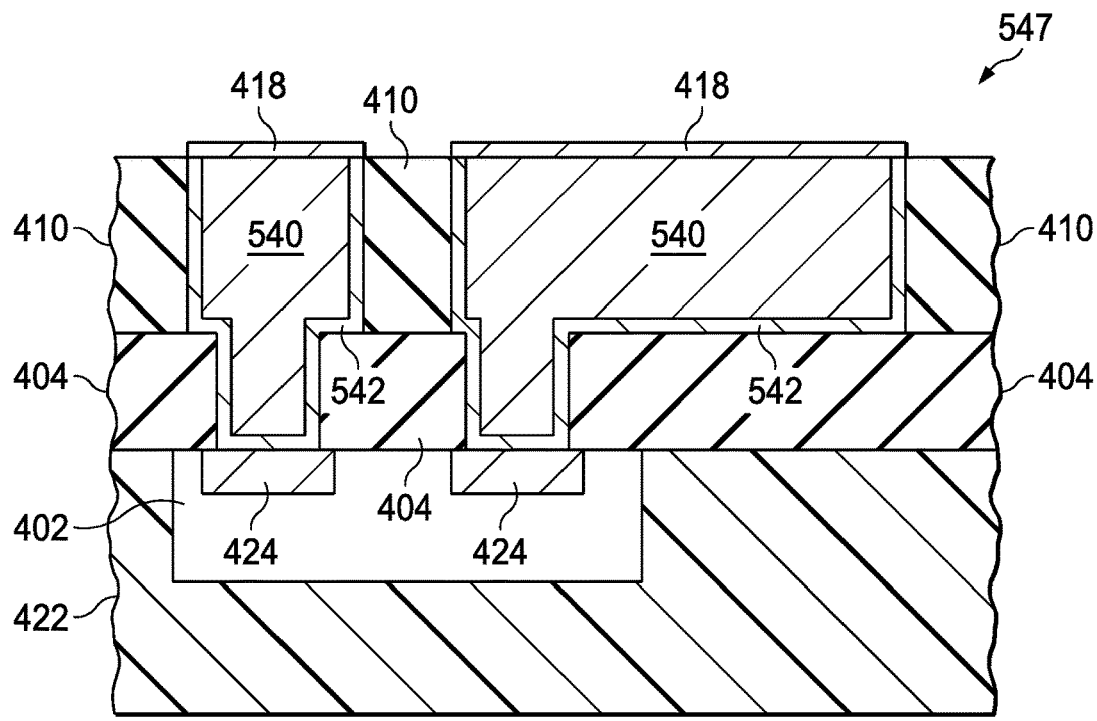

In FIG. 11F, a plating layer 418 is formed on the metal layer 540 by electroless plating, to form a semiconductor packaging structure 547. The plating layer 418 may be a solderable finish, for example composed of Ni/Sn, ENIG, ENEPPIG, ENEG, or Sn. The plating layer 418 extends laterally beyond the edge of the die 402. The metal layer 540 is completely surrounded by the seed layer 542 and the plate layer 418. The semiconductor packaging structure 547 may be attached to a PCB by the plating layer 418.

Figure 12:
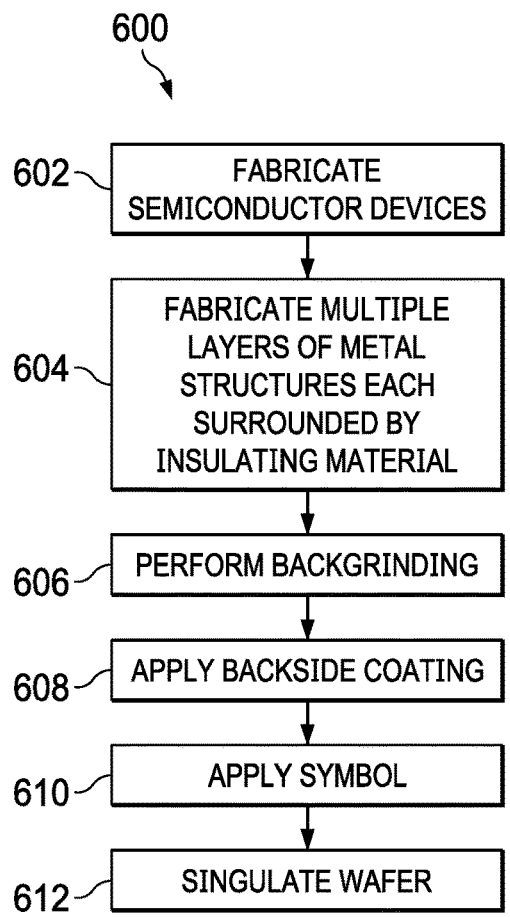
FIG. 12 illustrates a flowchart for an example method of fabricating a semiconductor packaging structure.

FIG. 12 illustrates a flowchart 600 for an example method of fabricating a semiconductor packaging structure. In a block 602, die are formed in integrated circuits. On the top portion of the wafer, the system fabricates bond pads for external connections.

In a block 604, the system fabricates multiple layers of metal structures, each surrounded by insulating material on the wafer fabricated in the block 602. FIGS. 6A-L and 1 and FIGS. 7A-G illustrate some example processes that may be performed in the block 604. Two, three, or more layers of an insulating material with increasingly wide metal structures are fabricated, with first metal layer on the first layer contacting the bond pads. The system applies a plate layer on the outermost metal layer. Accordingly, the system forms a semiconductor packaging structure.

In a block 606, the system performs backgrinding on the semiconductor packaging structure produced in the block 604, to produce a thinned wafer structure having a desired thickness. The system cleans the top surface of the semiconductor packaging structure. Also, the system applies protective tape over the top surface of the wafer, to protect the wafer from mechanical damage and contamination. The system loads the wafer onto a cassette, and places the cassette in a cassette holder of the backgrinding machine. The backgrinding machine picks up the back side of the wafer with a robotic arm, which positions the wafer for backgrinding. A grinding wheel performs backgrinding on the wafer. The system may continuously wash the wafer with deionized water during backgrinding. After backgrinding, the system returns the wafer to the cassette. The system removes the backgrinding tape from the wafer, for example using a de-tape tool.

In a block 608, the system applies a back side coat to the back of the thinned wafer structure produced in the block 604, to produce a coated wafer structure. The back side coat 122 may be an opaque film. The system may apply the back side coat to the wafer using spin coating or film attachment.

In a block 610, the system applies a symbol to the coated wafer structure, for example to the back side coat, generated a symbol wafer structure. The symbol identifies the die.

In a block 612, the system singulates the wafer, creating separately packaged die. The system mounts the symbol wafer structure on a plastic tape that is attached to a ring using an adhesive film. The system dices the wafer, for example using a metal or resin bond containing abrasive grit, for example natural diamond, synthetic diamond, or borazon. These die may then be attached to a PCB using the plating layer.

Figure 13:
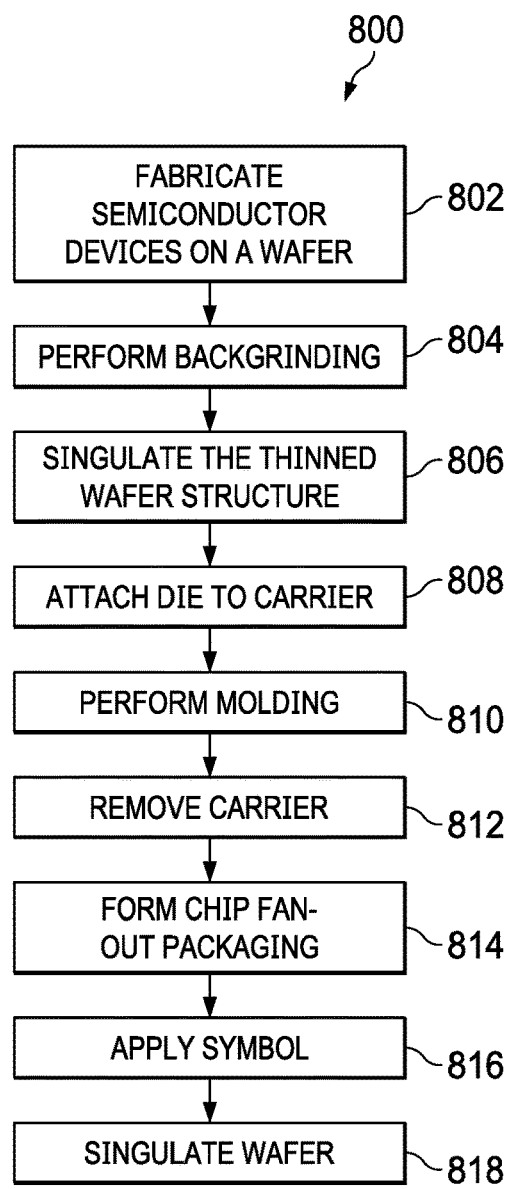
FIG. 13 illustrates a flowchart of another example method of fabricating a semiconductor packaging structure.

FIG. 13 illustrates a flowchart 800 for an example method of fabricating a semiconductor packaging structure. In a block 802, the system fabricates semiconductor devices on a wafer. Integrated circuits and associated elements are fabricated in the wafer, with bond pads providing external connections.

In a block 804, the system performs backgrinding on the wafer with the semiconductor devices fabricated in the block 802, to thin the wafer to the desired thickness, generating a thinned wafer structure. The system cleans the top surface of the wafer. Also, the system applies protective tape over the top surface of the wafer, to protect the wafer from mechanical damage and contamination. A grinding wheel performs backgrinding on the wafer. The system may continuously wash the wafer with deionized water during backgrinding. The system removes the backgrinding tape from the wafer.

In a block 806, the system singulates the thinned wafer structure to produce die. The system mounts the wafer on a plastic tape that is attached to a ring using an adhesive film. The system dices the wafer, for example using a metal or resin bond containing abrasive grit, such as natural diamond, synthetic diamond, or borazon.

In a block 808, the system attaches the die to a carrier with the bond pads face down on the carrier. The FIG. 10B illustrates an example of the process illustrated in the block 808. When an adhesive material, such as adhesive tape is used, the system directly attaches the die to the adhesive material. When a non-adhesive material, such as metal, a wafer, or a PCB panel is used, the system uses glue to attach the die to the carrier.

In a block 810, the system performs molding around the die. The FIG. 10C illustrates an example of the process performed in the block 810. In transfer molding, the system liquefies the mold compound and transfers the mold compound in a mold press. Then, the system cures the mold compound to harden the mold compound. The mold may be a plastic material, for example an epoxy resin.

In a block 812, the system removes the carrier, leaving a reconstituted wafer in which the mold compound holds the die. The FIG. 10D illustrates an example of the process performed in the block 812. The active side of the die with the bond pads is exposed.

In a block 814, the system forms chip fan-out packaging to the reconstituted wafer. Multiple layers of insulating materials with bond pads are fabricated, where the layer closest to the die has the narrowest features (first metal layer) and the layer farthest from the die has the widest bond pads. FIGS. 10E-O and 8 and FIGS. 11A-F illustrate examples of the process performed in the block 814. The bond pads on the upper layers may extend beyond the edge of the die. In at least one example, the upper metal layer electrically couples multiple die. The system also forms a plate layer over the outermost metal layer.

In a block 816, the system applies identifying symbols to the mold compound on the side opposite the metal layers.

In a block 818, the system singulates the wafer by dicing the mold compound between die, to form die. In one embodiment, each die is in a separate packaging structure. In other examples, multiple die are coupled together in a single packaging structure with the mold compound. The die may be attached to a PCB using the plating layer.

Figure 14:
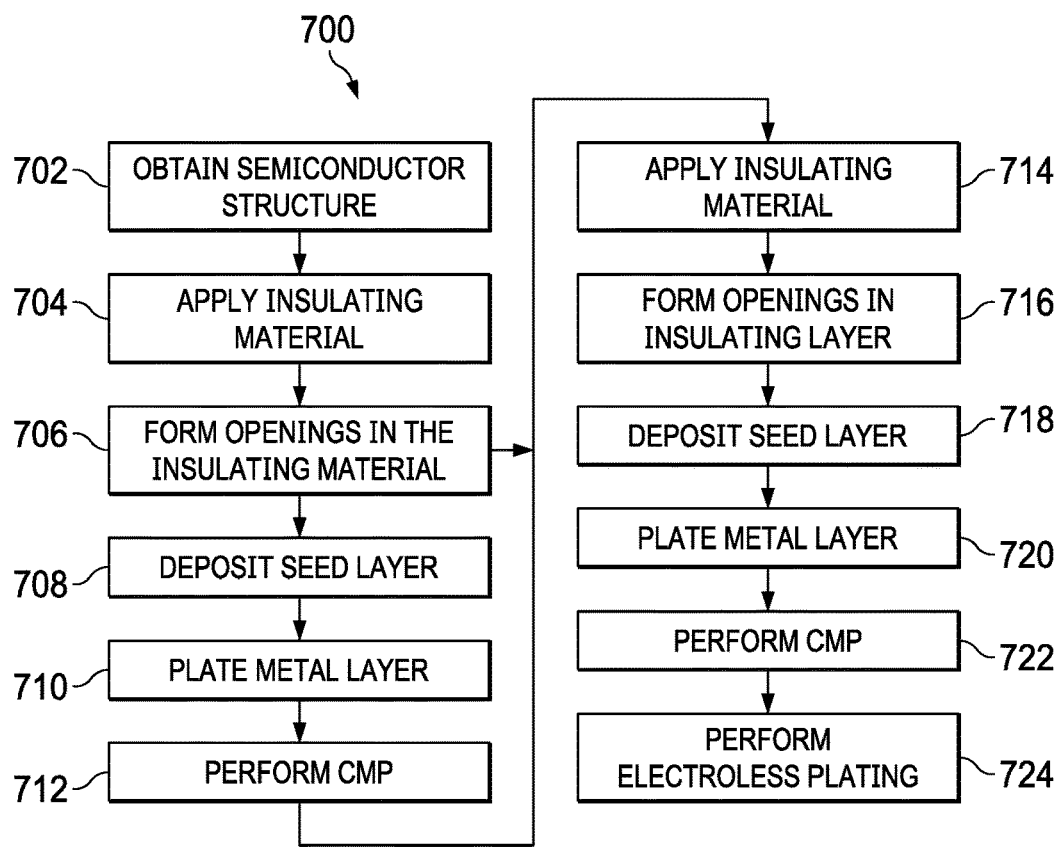
FIG. 14 illustrates a flowchart of an additional example method of fabricating a semiconductor packaging structure.

FIG. 14 illustrates a flowchart 700 for an example method of fabricating semiconductor packaging structures. The flowchart 700 describes a method that may be performed, for example, in the block 604 of the flowchart 600, the block 814 of the flowchart 800, FIGS. 6A-L and 1, FIGS. 7A-G, FIGS. 10A-O and 8, and FIGS. 11A-F. In a block 702, the system obtains a wafer or a die. The wafer or die contains at least one semiconductor device with bond pads. In one embodiment, the wafer is a reconstituted wafer containing die embedded in a mold compound.

In a block 704, the system applies an insulating material to the bond pad side of the wafer or die obtained in the block 702. The system may apply the insulating material by spin coating or laminating the insulating material on the wafer. The system may bake wafer to remove solvent from the insulating material. The insulating material may be a polymer, such as a permanent photoresist. In an example, the insulating material is a mold compound.

In a block 706, the system forms openings in the insulating material applied in the block 704. For example, the system performs photolithography on the insulating material, which is a permanent photoresist. The system exposes the permanent photoresist using a photolithography mask. Then, the system develops the permanent photoresist, and bakes the developed photoresist. In another example, the system patterns the insulating material by laser etching or plasma etching the insulating material. In one embodiment, the system proceeds to a block 714 to apply a second layer of insulating material. In another embodiment, the system proceeds to a block 708 to deposit a seed layer in the insulating material.

In the block 708, the system deposits a seed layer in the openings formed in the block 706 and over the insulating material. The seed layer may be, for example, composed of Ti, TiW, TiWCu, Ta, or TaN. The system may deposit the seed material by sputtering, evaporation, or CVD, to fully coat the openings, as well as coating the top of the insulating material.

In a block 710, the system plates metal, for example a copper containing material, over the seed layer formed in the block 708 in the openings. The system overplates the metal, extending the metal over the top of the insulating material.

In a block 712, the system performs CMP on the top portions of metal layer, the seed layer, and the insulating material, forming a planarized the top surface. Accordingly, the system produces a semiconductor post structure with semiconductor posts lined on the bottom and sides with a seed layer.

In the block 714, the system applies an insulating material over the first insulating material, for example by spin coating or laminating the insulating material. In one embodiment, the insulating material is deposited over the first metal layer structure formed in the block 712. In another embodiment, the insulating material is deposited in the openings formed in the block 706. The second insulating material may be the same material as the first insulating material. In other examples, the second insulating material is a different layer than the first insulating material. The second insulating material may be a photosensitive material, such as a permanent photoresist.

In a block 716, the system forms openings in the second insulating material. For example, the system performs photolithography to form the openings. The system exposes the permanent photoresist using a photolithography mask. Then, the system develops the permanent photoresist, and bakes the developed photoresist. In another example, the system patterns the insulating material by laser etching or plasma etching the insulating material.

In a block 718, the system deposits a seed layer over the second insulating material, including in the openings formed in the block 716. The system may deposit the seed layer by evaporation, sputtering, or CVD.

In a block 720, the system plates the seed layer, for example with a copper containing material, filling the openings in the insulating material. The system overplates the metal, so it extends over the top of the second insulating material.

In a block 722, the system performs CMP on the metal layer, the seed layer, and the insulating material, to form a planarized surface. Accordingly, the system forms a second metal layer structure, including a second metal layer at least partially surrounded by a seed layer. In at least one example, the thick meal layer structure extends laterally beyond the edge of the die.

In at least one example, blocks 714, 716, 718, 720, and 722 are repeated, to form additional layers of increasingly wide metal features surrounded by insulating material.

In a block 724, the system performs electroless plating, to form a plate layer on the second metal layer. The plate layer may be Ni/Sn, ENIG, ENEPPIG, ENEG, Sn, or another plate layer.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A semiconductor packaging structure, comprising:
   a die comprising a bond pad on a die surface;
   a segment of a first metal layer structure on the die, the segment of the first metal layer structure having a first width in a direction parallel to the die surface and a first thickness in a direction perpendicular to the die surface, the segment of the first metal layer structure comprising a first seed layer on the die and a first metal layer on the first seed layer, the first metal layer electrically coupled to the bond pad;
   a first photosensitive material around sides of the segment of the first metal layer structure;
   a segment of a second metal layer structure on the segment of the first metal layer structure and over a portion of the first photosensitive material, the segment of the second metal layer structure electrically coupled to the segment of the first metal layer structure, the segment of the second metal layer structure having a second width in the direction parallel to the die surface and a second thickness in the direction perpendicular to the die surface, wherein the second width of the segment of the second metal layer structure is greater than the first width of the segment of the first metal layer structure and the second thickness of the segment of the second metal layer structure is greater than the first thickness of the segment of the first metal layer structure, the second metal layer structure comprising a second metal layer and a second seed layer between the second metal layer and the first metal layer; and
   a second photosensitive material around sides of the segment of the second metal layer structure.

2. The semiconductor packaging structure of claim 1, wherein the first photosensitive material is a permanent photoresist.

3. The semiconductor packaging structure of claim 1, further comprising a plate layer over the second metal layer, wherein the plate layer and the second seed layer completely surround the second metal layer.

4. The semiconductor packaging structure of claim 1, wherein the first metal layer has a thickness between 3 μm and 100 μm, and the first metal layer has a width between 20 μm and 200 μm.

5. The semiconductor packaging structure of claim 1, wherein the second metal layer structure has a thickness of between 25 μm and 300 μm, and the second metal layer structure has a width of more than 150 μm.

6. The semiconductor packaging structure of claim 1, wherein the first metal layer has a cross section that is rectangular, square, circular, or oval, and wherein the second metal layer structure has a cross section that is rectangular, circular, oval, a polygon, or a polygon with rounded corners.

7. The semiconductor packaging structure of claim 1, wherein the bond pad is a first bond pad, and wherein the first metal layer structure electrically couples the second metal layer structure to a second bond pad of the die.

8. The semiconductor packaging structure of claim 1, wherein the first metal layer has a top surface contacting the second metal layer structure, the top surface of the first metal layer having a top width, and a bottom surface contacting the bond pad, the bottom surface having a bottom width, and wherein the top width is greater than the bottom width.

9. The semiconductor packaging structure of claim 1, wherein the bond pad is on a first side of the die, wherein the semiconductor packaging structure further comprises a back side coat on a second side of the die, the second side of the die opposite the first side of the die.

10. The semiconductor packaging structure of claim 9, wherein the back side coat is a black film.

11. The semiconductor packaging structure of claim 9, wherein the back side coat has a thickness between 10 μm and 60 μm.

12. The semiconductor packaging structure of claim 9, wherein the back side coat has a thickness that is less than 60 μm.

13. The semiconductor packaging structure of claim 1, wherein the first metal layer comprises copper or an alloy of conductive metals, and the second metal layer structure comprises copper, or an alloy of conductive metals.

14. The semiconductor packaging structure of claim 1, further comprising:
   a third metal layer structure over the second metal layer structure and over at least a portion of the second photosensitive material; and
   a third photosensitive material around sides of the third metal layer structure.

15. The semiconductor packaging structure of claim 14, wherein the third metal layer structure has a third width, and wherein the third width is greater than the second width.

16. The semiconductor packaging structure of claim 1, wherein the second metal layer structure has a planarized surface, the semiconductor packaging structure further comprising:
   a plate layer on the planarized surface of the segment of the second metal layer structure, wherein at least a portion of the plate layer extends above a top surface of the second photosensitive material.

17. The semiconductor packaging structure of claim 16, wherein the segment of the first metal layer has a thickness between 3 μm and 100 μm, and the segment of the first metal layer has a width between 25 μm and 200 μm.

18. The semiconductor packaging structure of claim 17, wherein the segment of the second metal layer structure has a thickness between 25 μm and 300 μm, and the segment of the second metal layer structure has a width greater than 150 μm.

19. The semiconductor packaging structure of claim 16, wherein the plate layer has a thickness between 2 μm and 8 μm.

20. The semiconductor packaging structure of claim 16, wherein a first metal structure comprises the first seed layer, the second seed layer, and the plate layer, a second metal structure comprises the first metal layer and the second metal layer, and the first metal structure surrounds the second metal structure.

21. The semiconductor packaging structure of claim 16, wherein the plate layer comprises Ni, NiAu, NiPd, NiPdAu, NiAg, Sn, NiSn, electroless nickel immersion gold (ENIG), electroless nickel electroless gold (ENEG), or electroless nickel electroless palladium immersion gold (ENEPIG).

22. The semiconductor packaging structure of claim 1, wherein the first metal layer structure and the second metal layer structure are configured to transfer at least 2 W of power.

23. The semiconductor packaging structure of claim 1, wherein the bond pad is a first bond pad, the die further comprises a second bond pad, wherein the first metal layer structure further comprises a third metal layer, the third metal layer electrically coupled to the second bond pad.

24. A semiconductor packaging structure, comprising:
a die comprising a bond pad;
a first metal layer structure on the die, the first metal layer structure comprising a first metal layer, the first metal layer electrically coupled to the bond pad;
a first photosensitive material around sides of the first metal layer structure;
a second metal layer structure over the first metal layer structure and over a portion of the first photosensitive material, the second metal layer structure electrically coupled to the first metal layer structure;
a second photosensitive material around sides of the second metal layer structure; and
a plate layer having a first plate surface and a second plate layer surface opposite the first plate surface, the first plate surface on the second metal layer structure, wherein the second plate layer surface is adapted to electrically and physically couple the semiconductor packaging structure to a printed circuit board (PCB).

25. The semiconductor packaging structure of claim 24, wherein the sides of the first metal layer structure are vertical.

26. The semiconductor packaging structure of claim 24, wherein the first photosensitive material has a modulus of elasticity of between 2 GPa and 6 GPa, the first photosensitive material has a Poisson ratio of between 0.2 and 0.25, the first photosensitive material has a film stress of between 15 Mpa and 65 Mpa, and the first photosensitive material has a coefficient of thermal expansion of between 20 ppm/K and 55 PPm/K.

27. The semiconductor packaging structure of claim 24, wherein the first photosensitive material is an epoxy based near ultraviolet photoresist.

28. The semiconductor packaging structure of claim 27, wherein the first photosensitive material is an acrylate based photoresist or a novalak based photoresist.

29. The semiconductor packaging structure of claim 27, wherein the first photosensitive material comprises SU-8.

30. The semiconductor packaging structure of claim 24, wherein the second photosensitive material has a thickness of greater than 80 μm.

31. The semiconductor packaging structure of claim 24, wherein the first metal layer structure has a planarized surface and the first photosensitive material has a planarized surface.

32. The semiconductor packaging structure of claim 24, wherein the plate layer is adapted to thermally couple the semiconductor packaging structure to the PCB.

33. A semiconductor packaging structure, comprising:
a die comprising a bond pad on a side of the die;
a first metal layer structure on the die, the first metal layer structure comprising a first metal layer, the first metal layer electrically coupled to the bond pad;
a first photosensitive material around sides of the first metal layer structure;
a second metal layer structure over the first metal layer structure and over a portion of the first photosensitive material, the second metal layer structure electrically coupled to the first metal layer structure, the second metal layer structure having a first thickness;
a second photosensitive material around sides of the second metal layer structure; and
a plate layer on the second metal layer structure, the plate layer electrically coupled to the second metal layer structure, the plate layer extending above a top surface of the second photosensitive material, wherein the bond pad is under the plate layer, the plate layer having a second thickness, the second thickness less than the first thickness.

34. The semiconductor packaging structure of claim 33, wherein the first metal layer structure is fully under the plate layer.

35. The semiconductor packaging structure of claim 33, wherein the sides of the first metal layer structure are vertical.

36. The semiconductor packaging structure of claim 33, wherein the first metal layer structure has a planarized surface and the first photosensitive material has a planarized surface.

37. The semiconductor packaging structure of claim 33, wherein the plate layer is configured to be attached to a printed circuit board (PCB).

38. The semiconductor packaging structure of claim 33, wherein the semiconductor packaging structure is mold-free.

39. A semiconductor packaging structure, comprising:
a die comprising a first bond pad and a second bond pad;
a first metal layer structure on the die, the first metal layer structure comprising:
a first segment of the first metal layer structure, the first segment of the first metal layer structure on the first bond pad; and
a second segment of the first metal layer structure, the second segment of the first metal layer structure on the second bond pad;
a first photosensitive material around sides of the first segment of the first metal layer structure, around sides of the second segment of the first metal layer structure, and between the first segment of the first metal layer structure and the second segment of the first metal layer structure;

a second metal layer structure on the first segment of the first metal layer structure, on the second segment of the first metal layer structure, and on a portion of the first photosensitive material, the second metal layer structure comprising a segment, the segment of the second metal layer structure electrically coupling the first segment of the first metal layer structure and the second segment of the first metal layer structure, the segment of the second metal layer structure over the first segment of the first metal layer structure, the second segment of the first metal layer structure, and a portion of the first photosensitive material between the first segment of the first metal layer structure and the second segment of the first metal layer structure; and a second photosensitive material around sides of the segment of the second metal layer structure.

40. The semiconductor packaging structure of claim 39, wherein the first photosensitive material is an epoxy based photoresist, an acrylate based photoresist, or a novalak based photoresist.

41. The semiconductor packaging structure of claim 39, wherein the die comprises a third bond pad, the segment of the second metal layer structure is a first segment of the second metal layer structure, the first metal layer structure further comprises a third segment on the third bond pad, wherein the first photosensitive material is around sides of the third segment of the first metal layer structure, wherein the first segment of the second metal layer structure is on the first segment of the first metal layer structure, on the second segment of the first metal layer structure, and on a portion of the first photosensitive material, the second metal layer structure electrically coupled to the first metal layer structure;

the second metal layer structure further comprising a second segment on the third bond pad; and wherein the second photosensitive material is around sides of the first segment of the second metal layer structure and around sides of the second segment of the second metal layer structure.

42. The semiconductor packaging structure of claim 41, wherein a width of the first segment of the second metal layer structure is greater than a width of the second segment of the second metal layer structure.

* * * * *